(12) United States Patent
Kitano

(10) Patent No.: US 8,743,595 B2
(45) Date of Patent: Jun. 3, 2014

(54) SIZE-REDUCED MAGNETIC MEMORY CELL

(75) Inventor: Naoki Kitano, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 75 days.

(21) Appl. No.: 13/615,192

(22) Filed: Sep. 13, 2012

(65) Prior Publication Data

US 2013/0064009 A1 Mar. 14, 2013

(30) Foreign Application Priority Data

Sep. 13, 2011 (JP) .................................. 2011-199042

(51) Int. Cl.
*G11C 11/00* (2006.01)
*G11C 11/16* (2006.01)
*H01L 27/112* (2006.01)

(52) U.S. Cl.
CPC ............... *G11C 11/16* (2013.01); *H01L 27/112* (2013.01)
USPC .......................................... 365/158; 365/173

(58) Field of Classification Search
CPC ............... G11C 11/16; H01L 27/112
USPC .................................................. 365/158, 173
See application file for complete search history.

(56) References Cited

U.S. PATENT DOCUMENTS

| | | | |
|---|---|---|---|
| 8,107,281 B2 * | 1/2012 | Kai et al. ....................... | 365/158 |
| 8,309,166 B2 * | 11/2012 | Liu et al. ........................ | 427/125 |
| 8,564,080 B2 * | 10/2013 | Chen et al. ..................... | 257/421 |
| 8,625,337 B2 * | 1/2014 | Wu et al. ........................ | 365/158 |
| 2010/0142264 A1 | 6/2010 | Numata et al. | |

FOREIGN PATENT DOCUMENTS

| JP | 2006-108609 A | 7/2006 |
|---|---|---|
| WO | WO-2007/020823 A1 | 2/2007 |

OTHER PUBLICATIONS

Fukami et al., "Low-Current Perpendicular Domain Wall Motion Cell for Scalable High-Speed MRAM" 2009 Symposium on VLSI Technology Digest of Technical Papers 12A-2.

* cited by examiner

*Primary Examiner* — Michael Tran
(74) *Attorney, Agent, or Firm* — McDermott Will & Emery LLP

(57) ABSTRACT

A semiconductor device includes: a first memory cell, a second memory cell adjacent to the first memory cell, first and second write bitlines and a common bitline. The first memory cell includes: a first magnetization fixed layer, a first magnetic recording layer, a first reference layer, a first tunnel barrier film, and a first transistor. The second memory cell includes: a second magnetization fixed layer, a second magnetic recording layer, a second reference layer, a second tunnel barrier layer and a second transistor. Each of the first and second reference layer has a fixed magnetization. A common magnetization fixed layer having a fixed magnetization is coupled to the first and second magnetic recording layers. The common magnetization fixed layer and the common bitline is connected so that the common magnetization fixed layer and the common bitline are unable to be electrically unconnected.

13 Claims, 29 Drawing Sheets

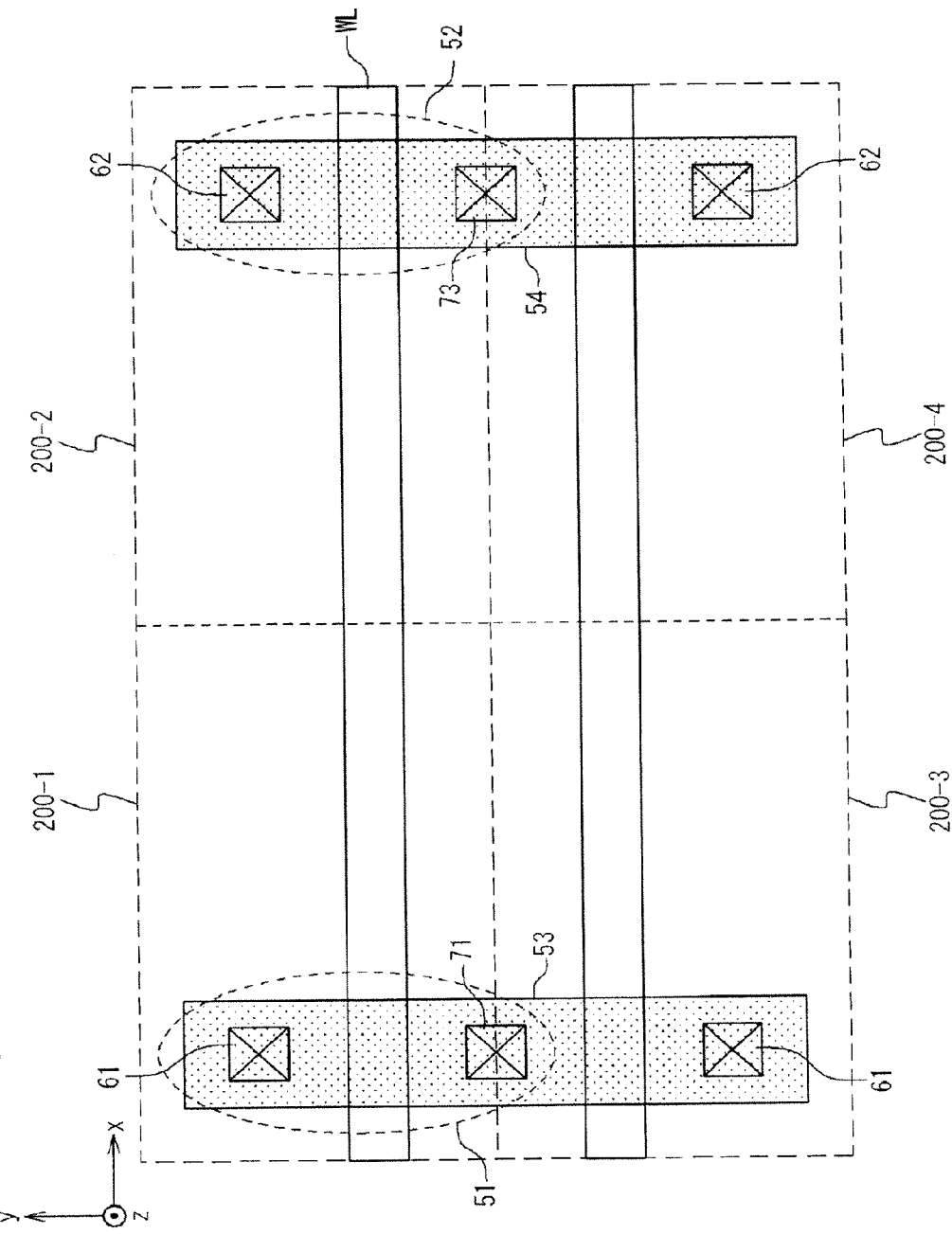

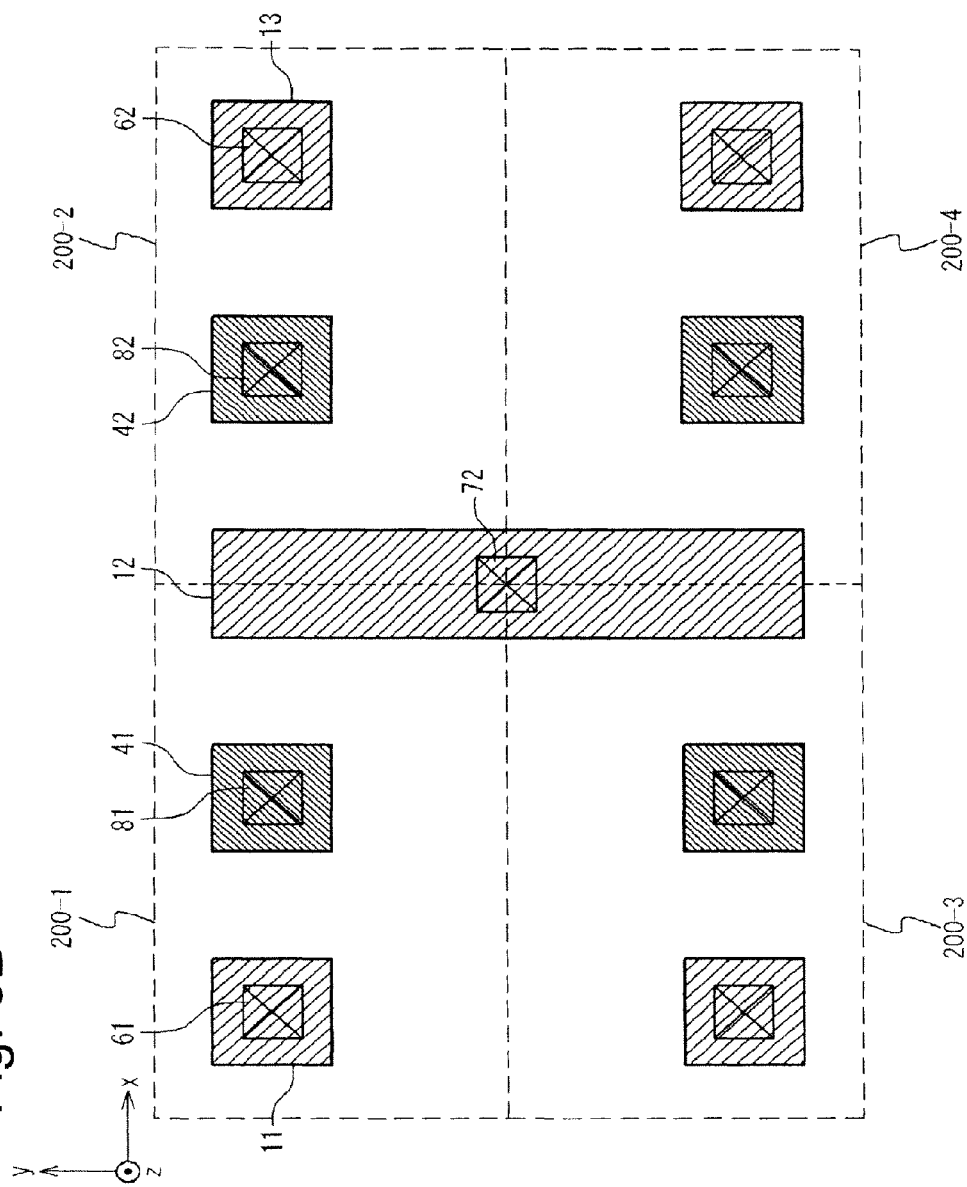

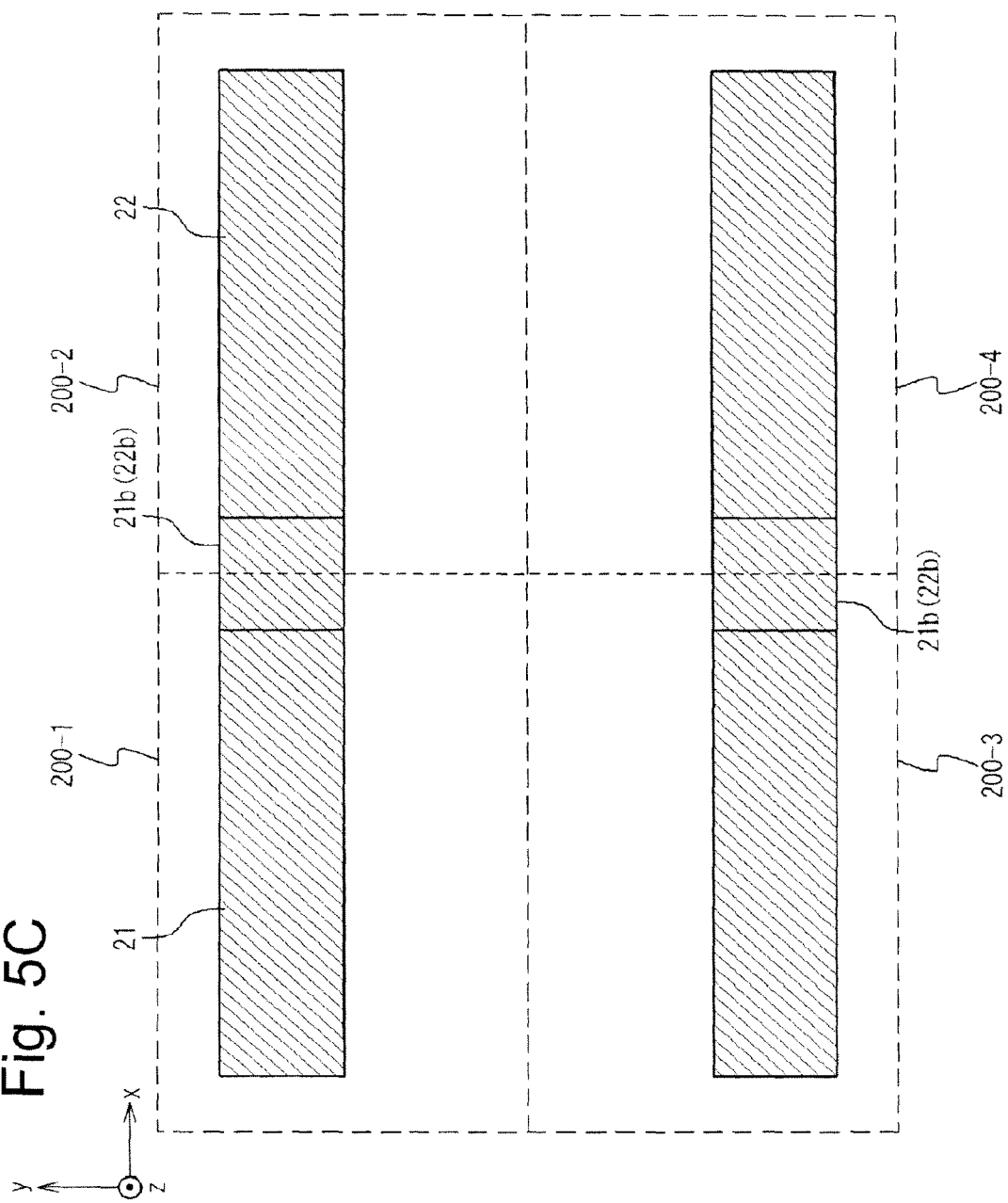

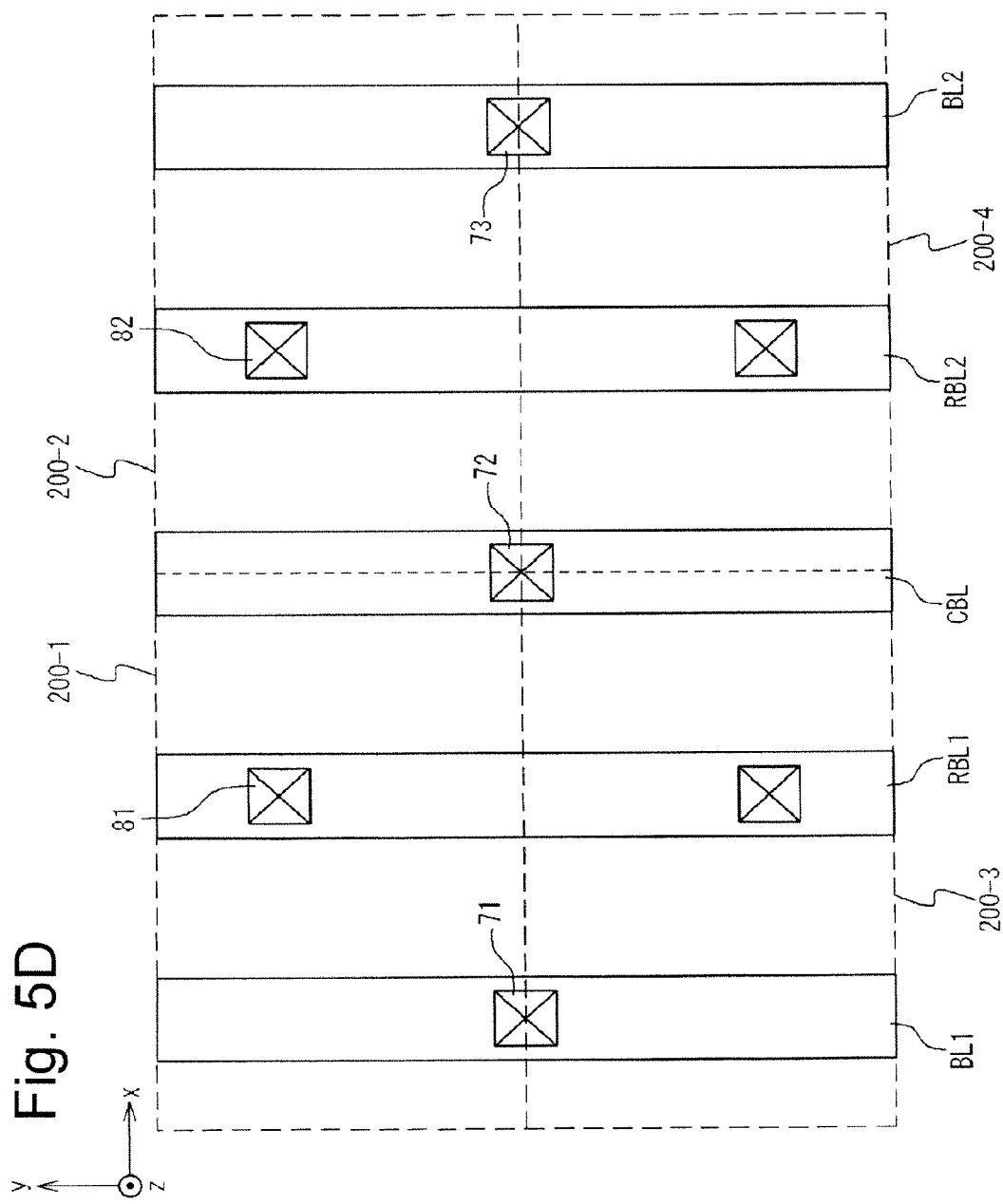

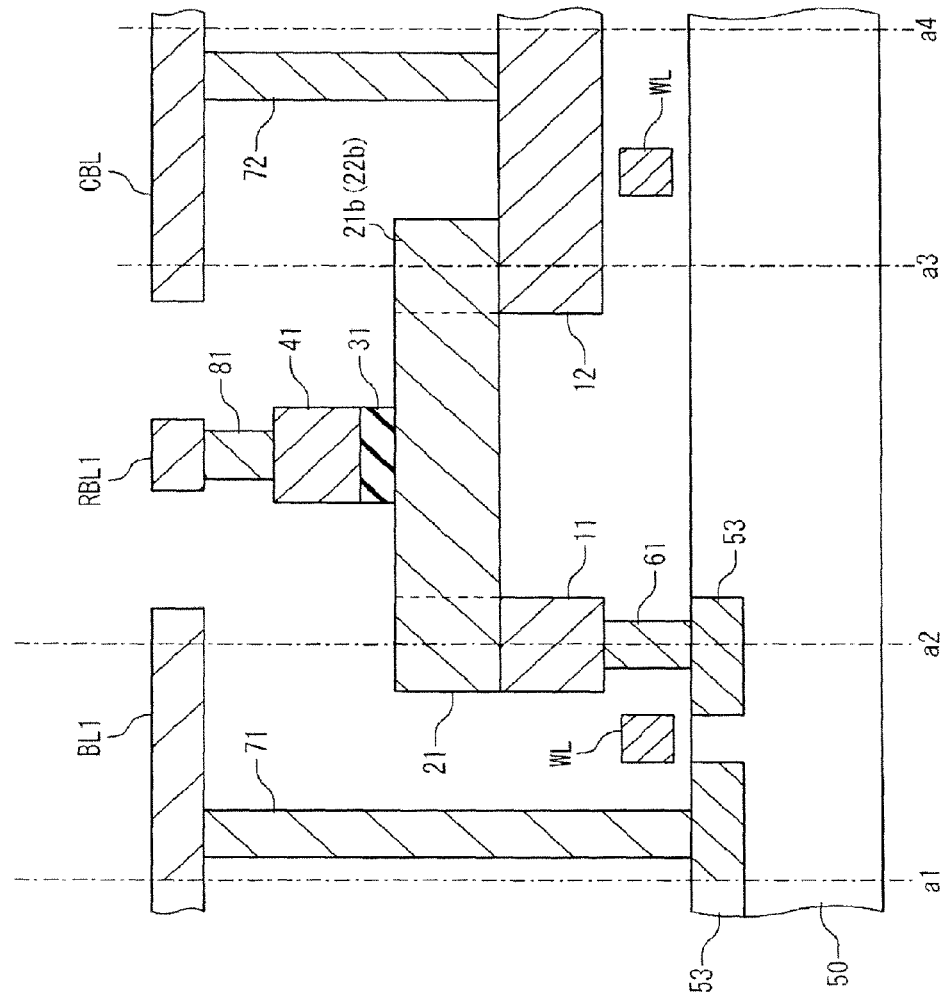

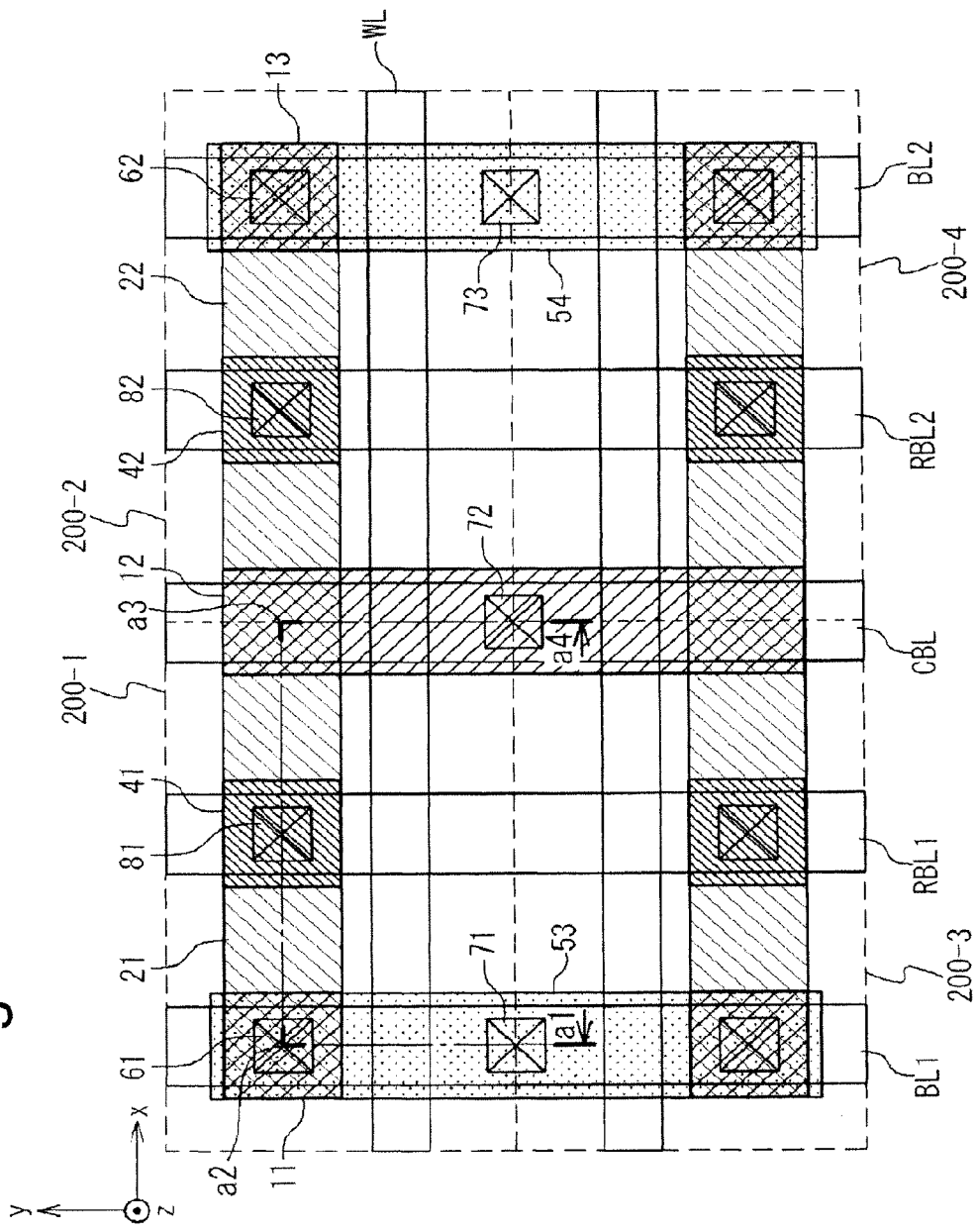

MEMORY STATE "0"

MEMORY STATE "1"

$I_{R0} > I_{R1}$

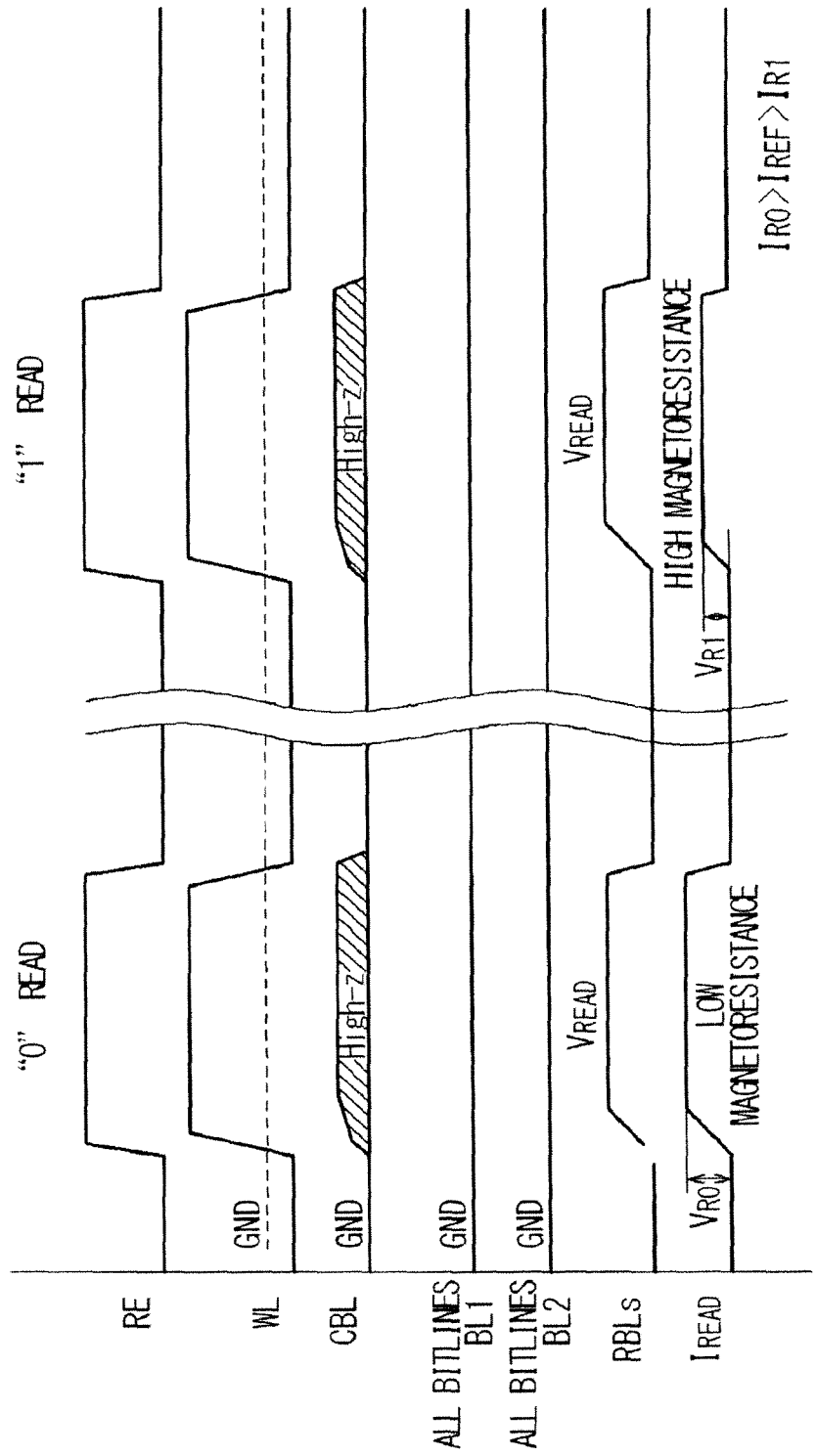

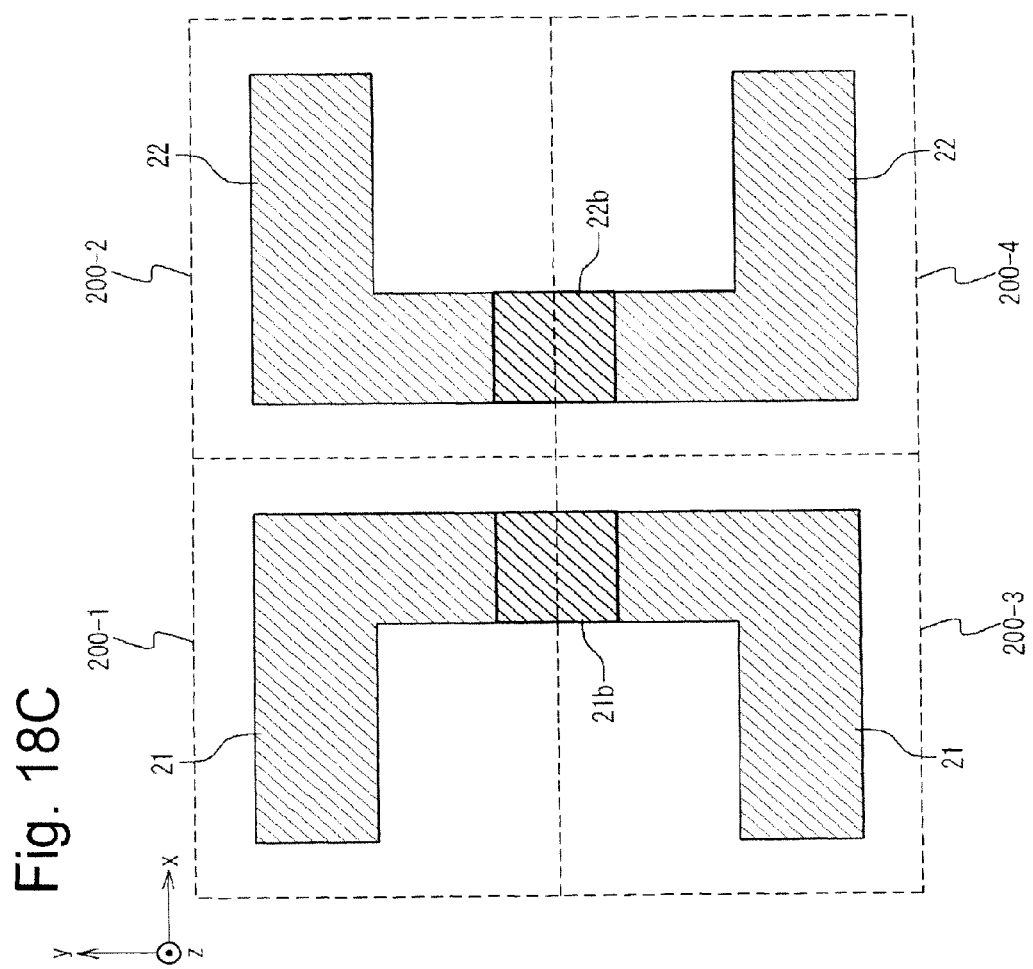

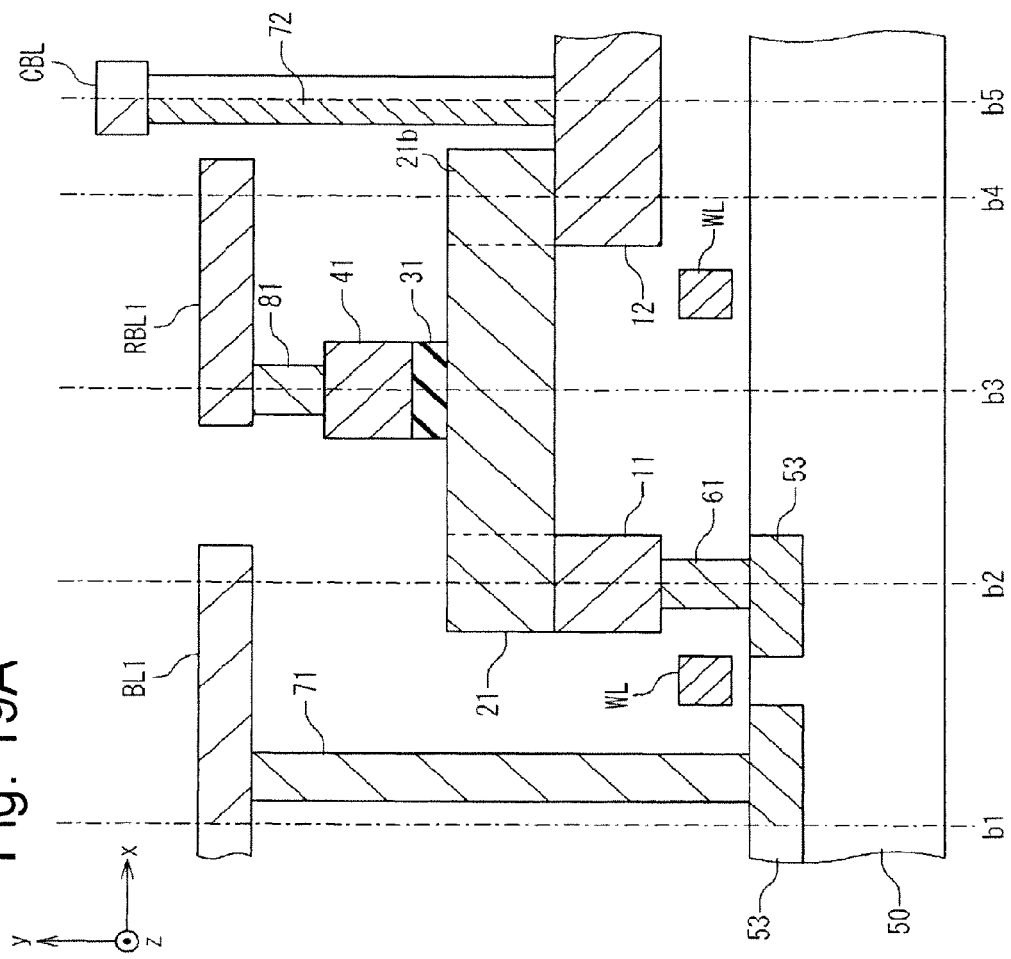

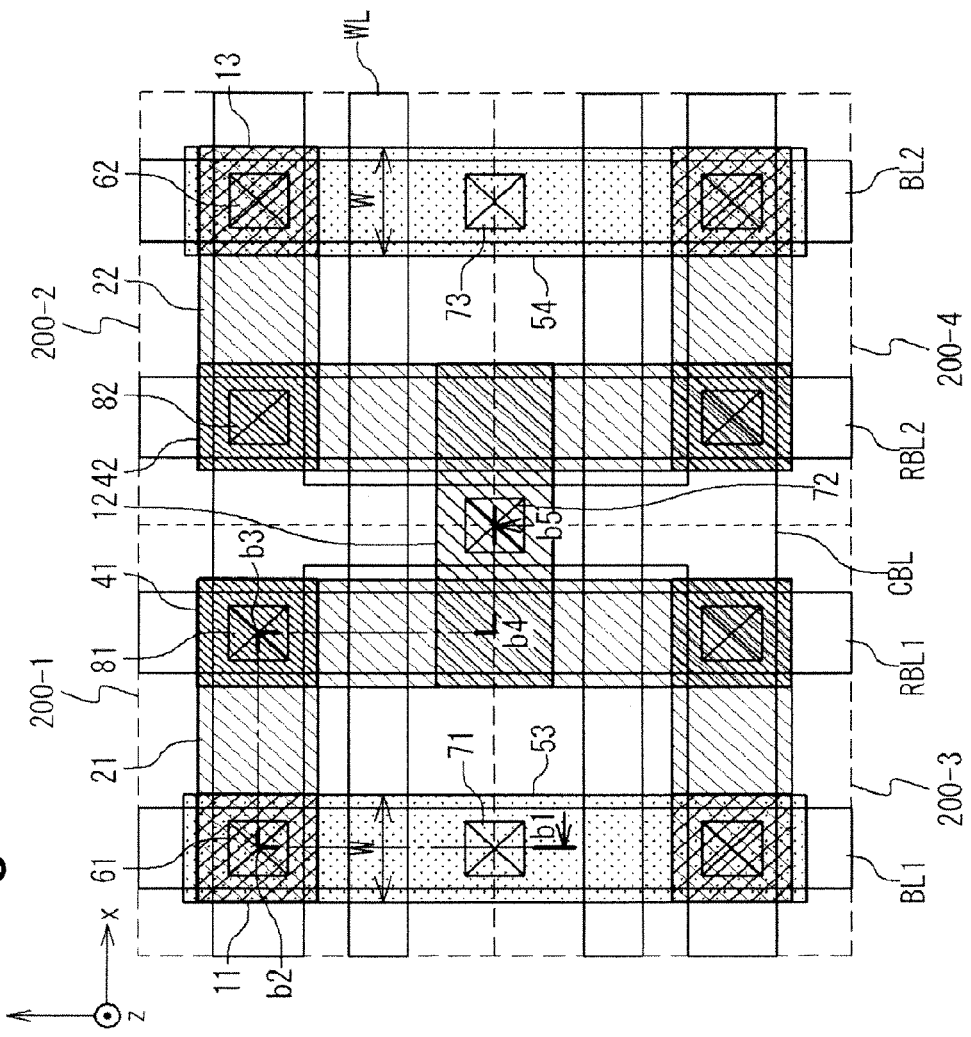

SIZE-REDUCED MAGNETIC MEMORY CELL

INCORPORATION BY REFERENCE

This application claims the benefit of priority based on Japanese Patent Application No. 2011-199042, filed on Sep. 13, 2011, the disclosure of which is incorporated herein by reference.

BACKGROUND

The present invention relates to a semiconductor device and magnetic random access memory (MRAM), more particularly, to a memory device incorporating a domain wall motion type magnetic memory cell.

Recently, the MRAM, which uses magnetoresistance effect elements as memory cells, has been proposed as one of non-volatile memories, which are a sort of semiconductor devices.

Magnetoresistance effect elements having a magnetic tunnel junction (which may be referred to as "MTJ", hereinafter) are often used as MRAM memory cells especially due to the advantage of a very large magnetoresistance effect. The magnetic tunnel junction has a laminated structure in which a non-magnetic dielectric film (hereinafter, referred to as tunnel barrier film) is disposed between two ferromagnetic films. Data are stored as the relative direction of the magnetizations of the two ferromagnetic films. In one example, the state in which the magnetizations are directed in parallel is correlated with data "0" and the state in which the magnetizations are directed in antiparallel is correlated with data "1". The electric resistance for a current flowing in the direction perpendicular to the film surface of the laminated structure varies depending on the relative angle of the magnetizations of the two ferromagnetic films. The electric resistance of the magnetic tunnel junction takes the minimum value when the magnetizations are directed in parallel, and takes the maximum value when the magnetizations are directed in antiparallel. The data read is achieved by using the variations in the electric resistance. The MRAM attracts a lot of attention in the field of embedded memories, and there is a demand for the high-speed random access of the MRAM as replacements of SRAMs (static random access memory) and DRAMs (dynamic random access memory).

Various MRAMs are known in the art and one type of the MRAM is the magnetic domain wall motion type. A magnetic domain wall motion type MRAM achieves data write by moving the magnetic domain wall through the spin transfer effect of spin-polarized electrons with a write current flowing in the in-plane direction of a ferromagnetic film and thereby directing the magnetization of the ferromagnetic film in the direction depending on the direction of the write current. Such a magnetic domain wall motion type MRAM is disclosed in 2009 Symposium on VLSI Technology Digest of Technical Papers 12A-2.

FIG. 1 shows the structure of a memory cell of the magnetic domain wall motion type MRAM disclosed in this document. The memory cell shown in FIG. 1 includes a magnetoresistance effect element 1 and NMOS transistors 51 and 52. The magnetoresistance effect element 1 includes: magnetization fixed layers 11, 12; a magnetic recording layer 2 disposed on the magnetization fixed layers 11, 12; a reference layer 4; and a tunnel barrier layer 3 disposed between the magnetic recording layer 2 and the reference layer 4. The magnetization fixed layers 11, 12 and the reference layer 4 are each formed of a ferromagnetic film having a fixed magnetization. The magnetic recording layer 2 is also formed of a ferromagnetic film. The magnetizations of regions 2a and 2b of the magnetic recording layer 2, which are coupled with the magnetization fixed layers 11 and 12, respectively, are fixed by the exchange couplings with the magnetization fixed layers 11 and 12. Hereinafter, the regions 2a and 2b may be referred to as magnetization fixed regions 2a and 2b, respectively. On the other hand, the region 2c between the magnetization fixed regions 2a and 2b has a reversible magnetization. The reference layer 4, the tunnel barrier layer 3 and the magnetization reversible region 2c form a magnetic tunnel junction (MTJ).

The NMOS transistor 51 has a drain connected to the magnetization fixed layer 11 and a source connected to a write bitline BL1. The NMOS transistor 52 has a drain connected to the magnetization fixed layer 12 and a source connected to a write bitline BL2. The gates of the NMOS transistors 51 and 52 are commonly connected to the word line WL. The reference layer 4 is connected to a read bitline RBL. In FIG. 1, the arrows 101, 102, 110 and 120 indicate the directions of the magnetizations of the respective layers.

The data write is achieved by generating a write current flowing between the write bitlines BL1 and BL2 with the NMOS transistors 51 and 52 turned on, and thereby switching the magnetization direction 110 of the magnetization reversible region 2c of the magnetic recording layer 2. The data reading is, on the other hand, achieved by supplying a read current flowing from the write bitline BL1 (or BL2) to the ground via the MTJ of the magnetoresistance effect element 1, and comparing the read current with a reference current by a sense amplifier (not shown).

FIG. 2 is a plan view showing the layout of the memory cells of the magnetic domain wall motion type MRAM shown in FIG. 1; four memory cells are shown in FIG. 2. The word lines WL are provided in the form of polysilicon gates and disposed to intersect diffusion layers 53 and 54. Each NMOS transistor 51 is formed by a word line WL and a diffusion layer 53, and each NMOS transistor 52 is formed by the word line WL and a diffusion layer 54. The magnetization fixed layers 11 and 12 are each connected to the drains of the NMOS transistors 51 and 52, respectively, via via-contacts 6. Furthermore, the sources of the NMOS transistors 51 and 52 are connected to the write bitlines BL1 and BL2, respectively via via-contacts 7. The read bitlines RBL are each disposed between the write bitlines BL1 and BL2 to extend in parallel to the write bitlines BL1 and BL2. The reference layers 4 are connected to the read bitlines RBL via via-contacts 8. In the layout shown in FIG. 2, the area of each memory cell is $18F^2$ ($=6F \times 3F$).

According to a study of the inventor, the above-described memory cell structure has a drawback of the increased memory cell area, because each memory cell incorporates two transistors (NMOS transistors 51 and 52) to control the direction of the write current. According to the study of the inventor, there is a room for reducing the area of the memory cell in the structure shown in FIGS. 1 and 2.

It should be noted that International Publication No. WO 2007/020823 A1 discloses a memory cell structure of a domain wall motion type MRAM, which incorporates a single transistor and a single MTJ. This International Publication, however, does not disclose any specific arrangement of a memory array in which such-structured memory cells.

SUMMARY

In one embodiment, a semiconductor device includes first and second memory cells, first and second write bitlines and a common bitline. The first memory cell includes: a first magnetization fixed layer having a magnetization fixed in a first direction; a first magnetic recording layer coupled to the first magnetization fixed layer and formed of ferromagnetic material; a first reference layer disposed opposed to the first magnetic recording layer; a first tunnel barrier layer disposed between the first magnetic recording layer and the first reference layer; and a first transistor connected between the first magnetization fixed layer and the first write bitline. The second memory cell includes: a second magnetization fixed layer having a magnetization fixed in the first direction; a second magnetic recording layer coupled to the second magnetization fixed layer and formed of ferromagnetic material; a second reference layer disposed opposed to the second magnetic recording layer; a second tunnel barrier layer disposed between the second magnetic recording layer and the second reference layer; and a second transistor connected between the second magnetization fixed layer and the second write bitline. Each of the first and second reference layers has a magnetization fixed in a direction selected from the first direction and a second direction opposite to the first direction. Furthermore, a common magnetization fixed layer having a magnetization fixed in the second direction is coupled to said first and second magnetization recording layer. The common magnetization fixed layer and the common bitline are connected so that the common magnetization fixed layer and the common bitline are unable to be electrically unconnected.

Such a structure effectively reduces the area of a magnetic memory cell of the domain wall motion type.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 5A is a diagram showing exemplary layouts of diffusion layers and word lines in the memory cells shown in FIG. 4;

FIG. 5B is a diagram showing exemplary layouts of magnetization fixed layers and reference layers in the memory cells shown in FIG. 4;

FIG. 5C is a diagram showing an exemplary layout of magnetic recording layers in the memory cells shown in FIG. 4;

FIG. 5D is a diagram showing exemplary layouts of write bitlines, read bitlines and a common bitline in the memory cells shown in FIG. 4;

FIG. 6A is a section view showing the cross section structure of the memory cells shown in FIG. 4 in the a1-a2-a3-a4 section.

FIG. 6B is a plan view showing the position of the a1-a2-a3-a4 section of FIG. 6A;

FIG. 11B is a timing chart showing a read operation of the domain wall motion type MRAM in the first embodiment;

FIG. 18C is a diagram showing an exemplary layout of magnetic recording layers of the memory cells shown in FIG. 17;

FIG. 19A is a section view showing an exemplary cross section structure of the memory cells shown in FIG. 17 in the b1-b2-b3-b4-b5 section; and FIG. 19B is a plan view showing the position of the b1-b2-b3-b4-b5 section of FIG. 19A.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 3:
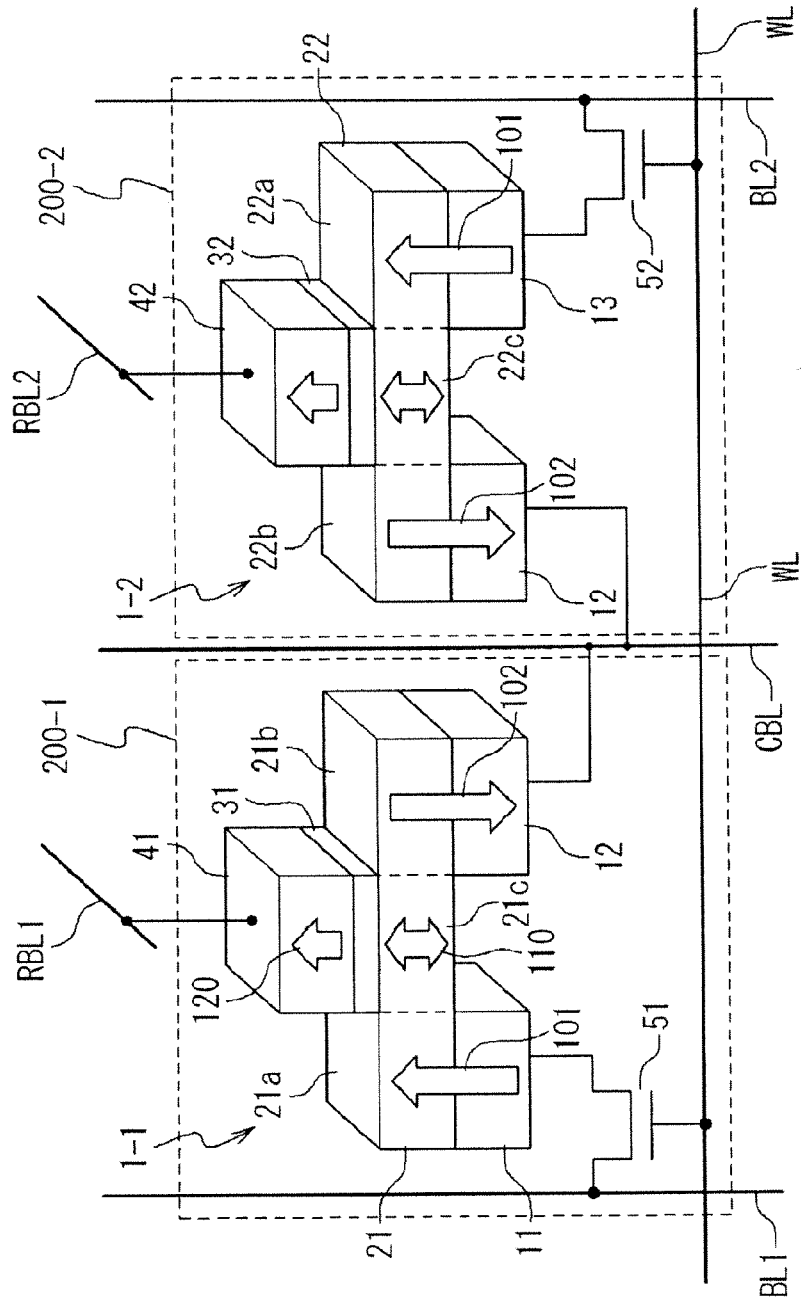
FIG. 3 is a diagram schematically showing an exemplary structure of a memory cell of a magnetic random access memory of a first embodiment.

FIG. 3 is a diagram schematically showing an exemplary structure of memory cells 200 of a magnetic random access memory according to a first embodiment. In FIG. 3, two memory cells 200-1 and 200-2 are shown. As described below, FIG. 3 shows the structure of the memory cells 200-1 and 200-2 only schematically and the structure shown in FIG. 3 may be different from the actual physical structure of the memory cells 200-1 and 200-2.

The memory cell 200-1 includes a magnetoresistance effect element 1-1 and an NMOS transistor 51. The magnetoresistance effect element 1-1 includes magnetization fixed layers 11, 12, a magnetic recording layer 21, a reference layer 41, and a tunnel barrier film 31 disposed between the magnetic recording layer 21 and the reference layer 41.

The magnetization fixed layers 11 and 12 are each formed of ferromagnetic material and have a fixed magnetization. The magnetization fixed layers 11 and 12 have magnetizations directed in the opposite directions. In this embodiment, the magnetization of the magnetization fixed layer 11 is fixed in the upward direction and the magnetization of the magnetization fixed layer 12 is fixed in the downward direction. Here, the "upward direction" and "downward direction" are defined on the basis of the lamination direction; the direction toward the top layer is defined as "upward direction" and the direction toward the bottom layer is defined as "downward direction".

The magnetic recording layer 21 is also formed of ferromagnetic material. It should be noted that the magnetizations of regions 21a and 21b of the magnetic recording layer 21 which are coupled to the magnetization fixed layers 11 and 12, respectively, are fixed by the exchange couplings with the magnetization fixed layers 11 and 12. The regions 21a and 21b may be referred to as magnetization fixed regions 21a and 21b, hereinafter. The magnetization of the magnetization fixed region 21a is fixed in the upward direction as is the case with the magnetization fixed layer 11 and the magnetization of the magnetization fixed region 21b is fixed in the downward direction as is the case with the magnetization fixed layer 12. The magnetization direction of the magnetization fixed layer 11 and the magnetization fixed region 21a is indicated by the arrow 101 and the magnetization direction of the magnetization fixed layer 12 and the magnetization fixed region 21b is indicated by the arrow 102. The region 21c between the regions 21a and 21b, on the other hand, has a magnetization reversible between the upward and downward directions. The region 21c may be referred to as magnetization reversible region 21c.

The tunnel barrier film 31 is formed of non-magnetic dielectric material, and the reference layer 41 is formed of ferromagnetic material and has a fixed magnetization. In this embodiment, the magnetization of the reference layer 41 is fixed in the upward direction. The magnetization of the reference layer 41 may be fixed in the downward direction instead. The reference layer 41, the tunnel barrier layer 31 and the magnetization reversible region 21c form a magnetic tunnel junction (MTJ). The reference layer 41 is connected to a read bitline RBL1.

The NMOS transistor 51 is used to select the magnetoresistance effect element 1-1 in write and read operations. The NMOS transistor 51 has a drain connected to the magnetization fixed layer 11, a source connected to a write bitline BL1 and a gate connected to a word line WL. The magnetization fixed layer 12 is connected to a common bitline CBL.

The memory cell 200-2, which is structured similarly to the memory cell 200-1, includes magnetoresistance effect element 1-2 and an NMOS transistor 52. The magnetoresistance effect element 1-2, which is structured similarly to the magnetoresistance effect element 1-1, includes magnetization fixed layers 12, 13, a magnetic recording layer 22, a reference layer 42 and a tunnel barrier layer 32 disposed between the magnetic recording layer 22 and the reference layer 42. The magnetization fixed layer 13, the magnetic recording layer 22, the reference layer 42 and the tunnel barrier layer 32 of the magnetoresistance effect element 1-2 are components corresponding to the magnetization fixed layer 11, the magnetic recording layer 21, the reference layer 41 and the tunnel barrier layer 31 of the magnetoresistance effect element 1-1, respectively. The magnetization of the magnetization fixed region 22a of the magnetic recording layer 22 is fixed in the upward direction as is the case with the magnetization fixed layer 13 and the magnetization of the magnetization fixed region 22b is fixed in the downward direction as is the case with the magnetization fixed layer 12. The magnetization reversible region 22c disposed between the magnetization fixed regions 22a and 22b has a magnetization reversible between the upward and downward directions. The magnetization of the reference layer 42 is fixed in the upward direction. The NMOS transistor 52 has a drain connected to the magnetization fixed layer 13, a source connected to a write bitline BL2 and a gate connected to the word line WL. Also, the magnetization fixed layer 12 is connected to the common bitline CBL and the reference layer 42 is connected to a read bitline RBL2.

In this embodiment, the word line WL is formed in the form of a polysilicon interconnection and the read bitlines RBL1, RBL2, the write bitlines BL1, BL2 and the common bitline CBL are formed in the form of metal interconnections.

In the domain wall motion type MRAM of this embodiment, one of the magnetization fixed layers (that is, the magnetization fixed layer 12) of the respective memory cells 200-1 and 200-2 are commonly connected to the common bitline CBL and the common bitline CBL is shared by the memory cells 00-1 and 200-2. Such a structure allows reducing the number of transistors within each memory cell 200 to one and thereby reducing the area of each memory cell 200.

Figure 4:
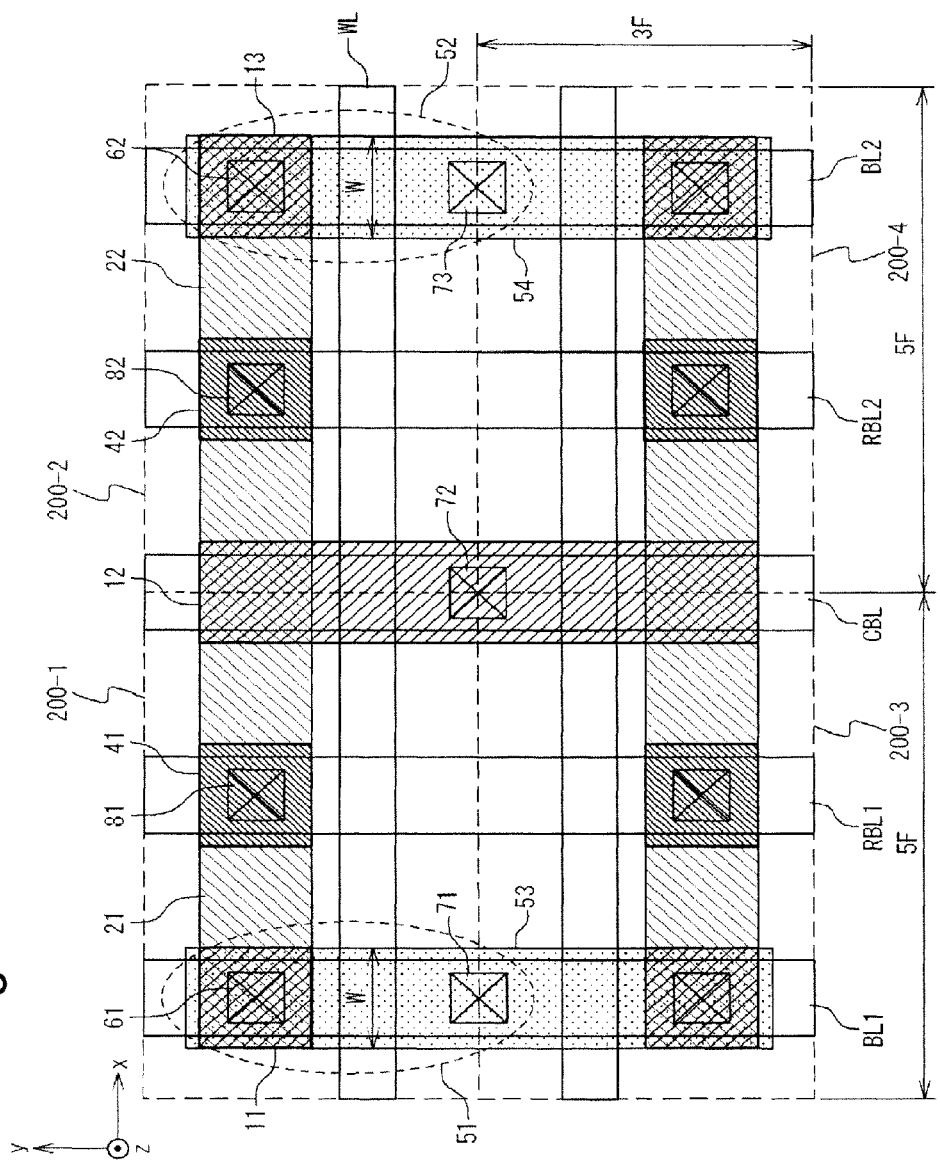
FIG. 4 is a diagram showing an exemplary layout of memory cells in the first embodiment.

FIG. 4 is a plan view showing an exemplary layout of memory cells 200 of the domain wall motion type MRAM of the first embodiment. FIGS. 5A to 5D are plan views showing layouts of individual components of the memory cells 200. FIG. 6A is a section view showing the cross section structure of the memory cells 200. It should be noted that four memory cells 200-1 to 200-4 are shown in FIGS. 4 and 5A to 5D, and FIG. 6A shows the cross section structure in the a1-a2-a3-a4 section indicated in FIG. 6B. The following description refers to an x-y-z orthogonal coordinate system. The x direction is defined in the horizontal direction in FIGS. 4 and 5A to 5D (that is, the direction in which the word lines WL are extended), and the y direction is defined in the vertical direction in FIGS. 4 and 5A to 5D (that is, the direction in which the write bitlines BL1, BL2, the read bitlines RBL1, RBL2 and the common bitline CBL are extended). The z direction is defined as the direction perpendicular to the x and y directions (the lamination direction in the manufacture process of the domain wall motion type MRAM). The in-plane layout of the memory cells 200-3 and 200-4 and that of the memory cells 200-1 and 200-2 are in line symmetry with respect to the memory cell boundary which extends in the x direction. Accordingly, only the structure of the memory cells 200-1 and 200-2 is described below.

As shown in FIGS. 4, 5A and 5B, diffusion layers 53 and 54 are disposed to extend in the y direction, and word lines WL are disposed to extend in the x direction, intersecting the diffusion layers 53 and 54. The regions of the word lines WL which overlap the diffusion layers 53 and 54 are used as the gates of the NMOS transistors 51 and 52. The drains of the NMOS transistors 51 and 52 are connected to the magnetization fixed layers 11 and 13 via via-contacts 61 and 62, respectively. The sources of the NMOS transistors 51 and 52 are connected to the write bitlines BL1 and BL2 via via-contacts 71 and 73, respectively. The via contact 71, which is disposed to overlap the boundary between the memory cells 200-1 and 200-3, is shared by the memory cells 200-1 and 200-3. Similarly, the via contact 73, which is disposed to overlap the boundary between the memory cells 200-2 and 200-4, is shared by the memory cells 200-2 and 200-4. The arrangement in which each of the via-contacts 71 and 73 is shared by two memory cells 200 is effective for reducing the area of the memory cells 200.

As shown in FIG. 5B, each of the memory cells 200-1 to 200-4 incorporates the magnetization fixed layer 11 or 13 and additionally incorporates the magnetization fixed layer 12. In this embodiment, the magnetization fixed layer 12 of the memory cells 200-1 to 200-4 is formed as a physically unitary component, and the magnetization fixed layer 12 is disposed to overlap the boundary between the memory cells 200-1 and 200-2 and the boundary between the memory cells 200-3 and 200-4. The magnetization fixed layer 12 is connected to the common bitline CBL via a via-contact 72. The via contact 72 is disposed to overlap the boundaries of the memory cells 200-1 to 200-4 and shared by the memory cells 200-1 to 200-4. The arrangement in which the via-contact 72 is shared by the four memory cells 200 is effective for reducing the area of the memory cells 200.

As shown in FIGS. 4 and 5C, the magnetic recording layers 21 and 22 are disposed to extend in the x direction. In this embodiment, the magnetic recording layers 21 and 22 of the memory cells 200-1 and 200-2, which adjoin each other, are formed as a physically unitary component. Also, the magnetization fixed regions 21b and 22b of the magnetic recording layers 21 and 22, which are coupled to the magnetization fixed layer 12, are shared by the memory cells 200-1 and 200-2. Such a structure is also effective for reducing the area of the memory cells 200.

Referring back to FIGS. 4 and 5B, the reference layer 41 is disposed between the magnetization fixed layers 11 and 12 and the reference layer 42 is disposed between the magnetization fixed layers 13 and 12. The reference layers 41 and 42 are connected to the read bitlines RBL1 and RBL2 via via-contacts 81 and 82, respectively.

As shown in FIGS. 4 and 5D, the write bitlines BL1, BL2, the read bitlines RBL1, RBL2 and the common bitline CBL are each disposed to extend in the y direction. The read bitline RBL1 is positioned between the write bitline BL1 and the common bitline CBL, and the read bitline RBL2 is positioned between the write bitline WBL2 and the common bitline CBL. The common bitline CBL is shared not only by the memory cells 200-1 and 200-2, but also by the memory cells 200-3 and 200-4; the common bitline CBL is disposed to overlap the boundary between the memory cells 200-1 and 200-2 and the boundary between the memory cells 200-3 and 200-4. Such a structure is also effective for reducing the area of the memory cells 200.

Figure 1:
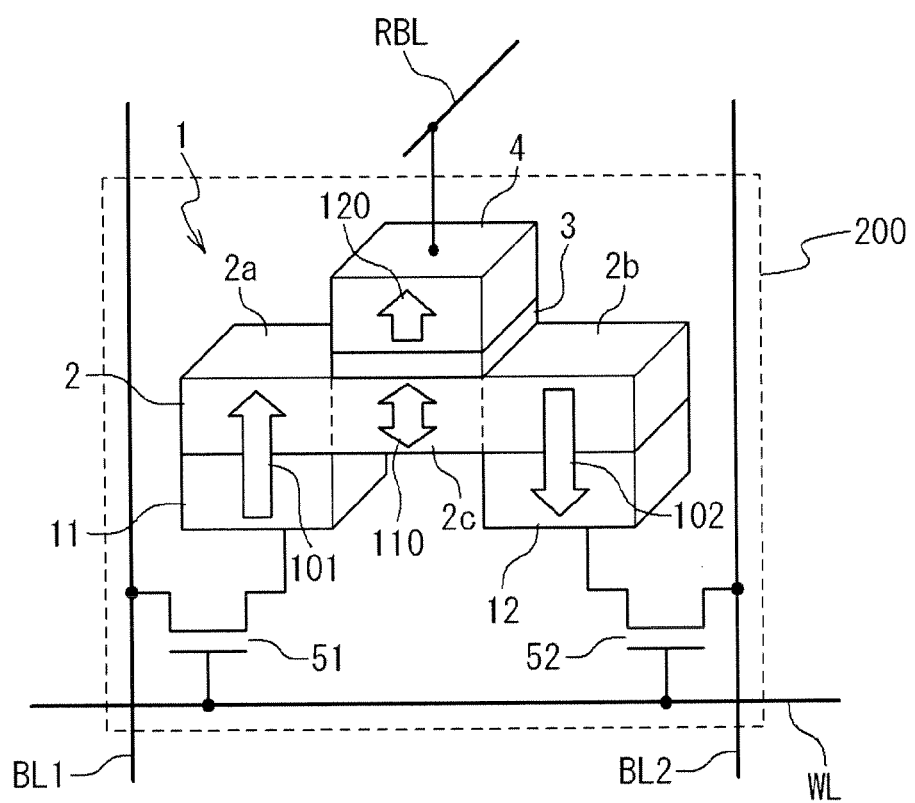
FIG. 1 is a diagram showing the structure of a memory cell of a known magnetic random access memory.
Figure 2:
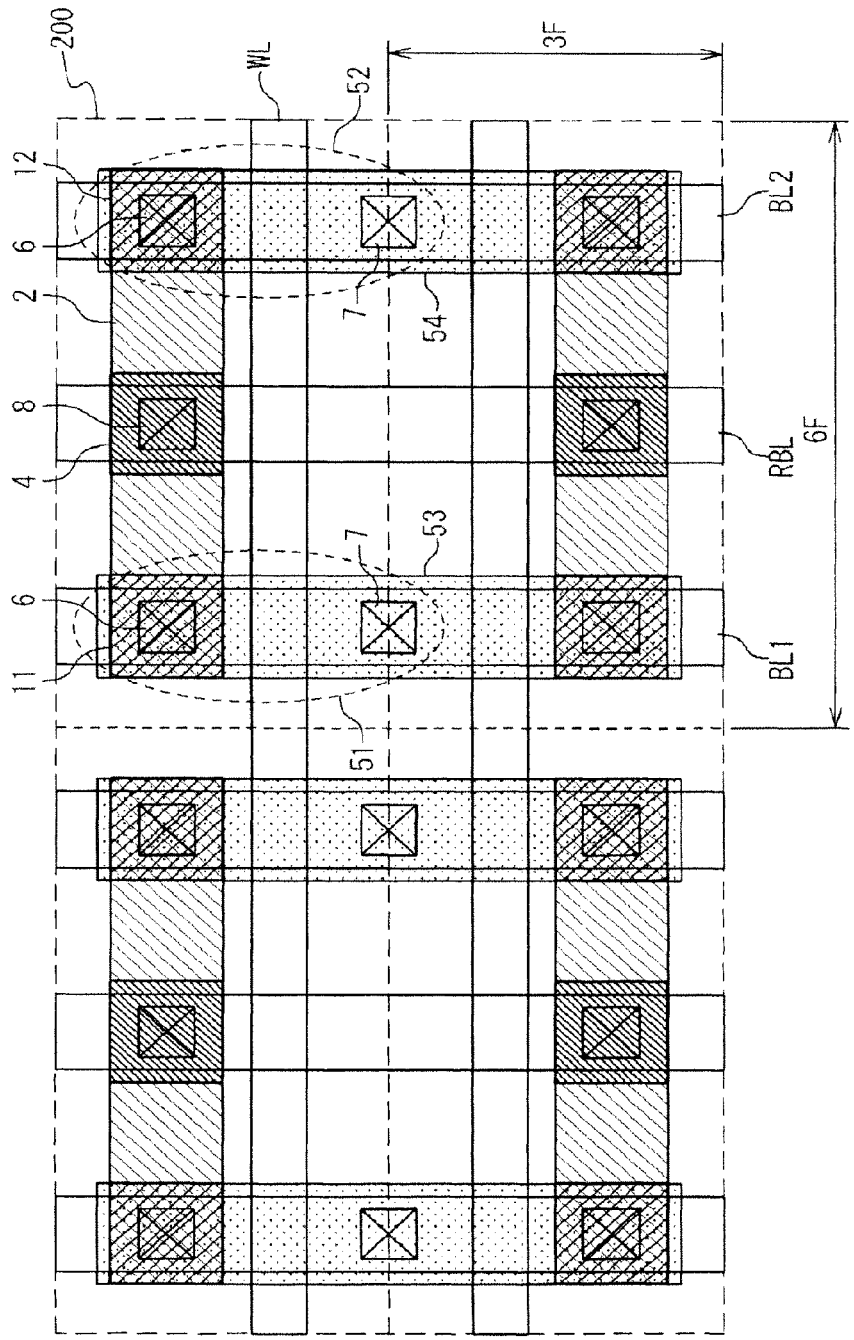
FIG. 2 is a diagram showing the layout of the memory cell shown in FIG. 1.

The memory cell layout of this embodiment shown in FIGS. 4 and 5A to 5D effectively reduces the area of the memory cells 200. For example, the number of bitlines which intersect the two memory cells 200 arranged in the x direction is six in the layout shown in FIG. 2, while the number of bitlines which intersect the two memory cells 200 arranged in the x direction is five in the layout of this embodiment. In terms of the memory cell area, the total area of two memory cells is $36F^2$ ($=6F \times 3F \times 2$) in the layout shown in FIG. 2, while the total area of two memory cells is $30F^2$ ($=5F \times 3F \times 2$) in the layout of this embodiment. As thus discussed, the layout of this embodiment effectively suppresses the increase in the memory cell area, allowing improvement in the degree of integration.

Figure 7A:
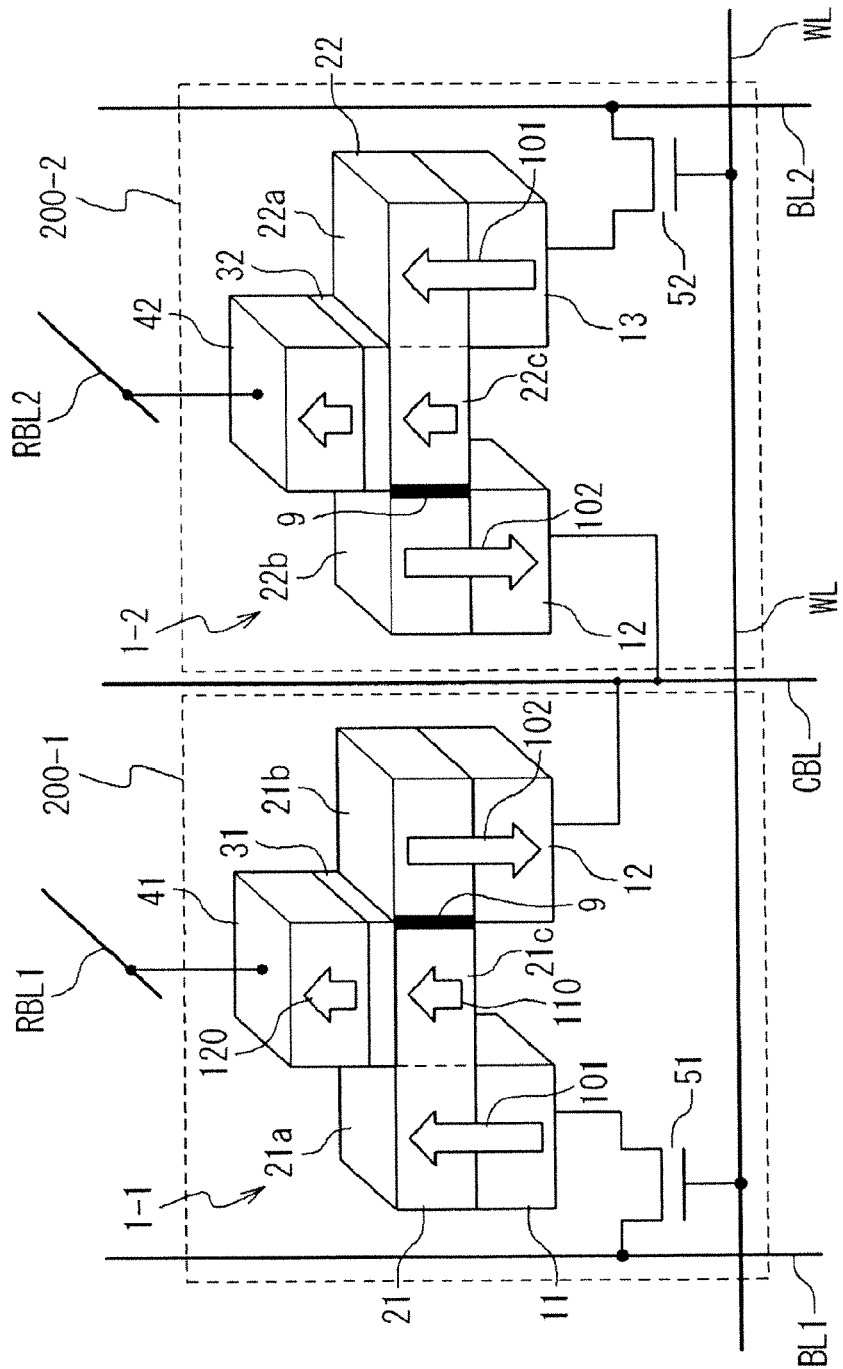
FIG. 7A is a diagram showing the state of a memory cell in the first embodiment for the case when the memory cell stores data "0"
Figure 7B:
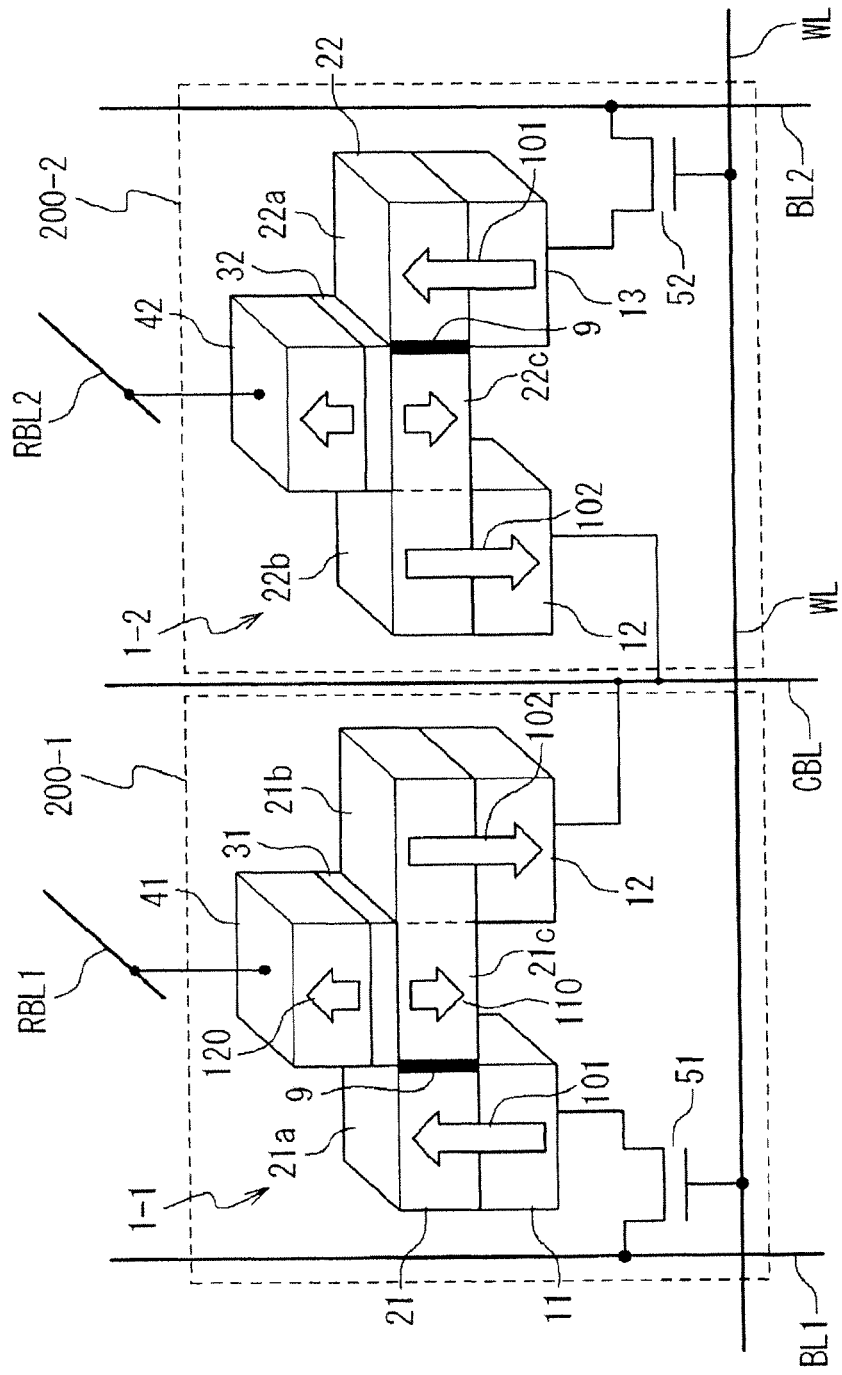
FIG. 7B is a diagram showing the state of a memory cell in the first embodiment for the case when the memory cell stores data "1"

FIGS. 7A and 7B show memory states of a memory cell 200. In detail, FIG. 7A shows the state in which the memory cell 200 stores data "0" and FIG. 7B shows the state in which the memory cell 200 stores data "1". In this embodiment, the memory cell 200 is defined as storing data "0" when the MTJ formed by the reference layers 41 or 42, the tunnel barrier film 31 or 32 and the magnetic recording layer 21 or 22 is placed in the low resistance state, and defined as storing data "1" when the MTJ is placed in the high resistance state. It should be noted that the MTJ is placed in the low resistance state when the magnetizations of the reference layer 41 (or 42) and the magnetization reversible region 21c (or 22c) are directed in parallel and the MTJ is placed in the high resistance state when the magnetizations of the reference layer 41 (or 42) and the magnetization reversible region 21c (or 22c) are directed in anti-parallel. As is well known in the art, the relation between data "0", "1" and the resistance of the MTJ can be easily defined by the operations of peripheral circuits. It should be noted that the "anti-parallel" indicates the state in which the directions of two relevant magnetizations are at a relative angle of 180 degrees.

As shown in FIG. 7A, the domain wall 9 is positioned between the reference layer 41 and the magnetization fixed layer 12 when data "0" are stored in the memory cell 200-1. In this case, the magnetization direction of the reference layer 41 (indicated by the arrow 120) is directed in parallel to the magnetization direction of the magnetization reversible regions 21c of the magnetic recording layer (indicated by the arrow 110), and therefore the MTJ of the memory cell 200-1 is placed into the low resistance state. This applies to the memory cell 200-2; the domain wall 9 is positioned between the reference layer 42 and the magnetization fixed layer 12 when data "0" are stored in the memory cell 200-2.

When data "1" are stored in the memory cell 200-1, on the other hand, the domain wall 9 is positioned between the reference layer 41 and the magnetization fixed layer 11. In this case, the magnetization direction of the reference layer 41 (indicated by the arrow 120) is directed in anti-parallel to the magnetization direction of the magnetization reversible regions 21c of the magnetic recording layer 21 (indicated by the arrow 110), and therefore the MTJ of the memory cell 200-1 is placed into the high resistance state. This also applies to the memory cell 200-2; the domain wall 9 is positioned between the reference layer 42 and the magnetization fixed layer 13 when data "0" are stored in the memory cell 200-2.

Figure 8A:
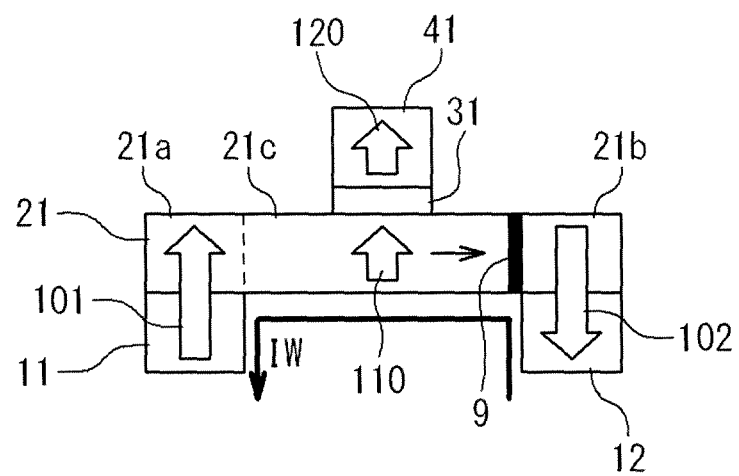
FIGS. 8A and 8B are diagrams showing a data write operation in the first embodiment.
Figure 8B:
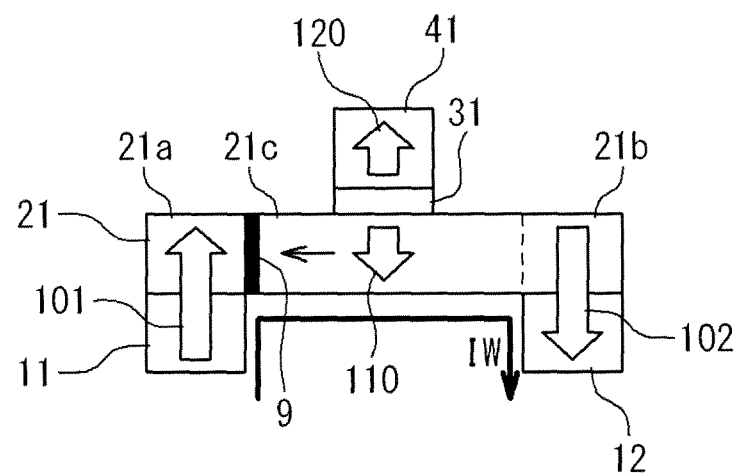

FIGS. 8A and 8E are schematic diagrams showing the write operation into a memory cell 200 in this embodiment. Although the write operation into the memory cell 200-1 is shown in FIGS. 8A and 8B, the data writing into the memory cell 200-2 can be achieved in the same way.

The write of data "0" is achieved by generating a write current IW flowing from the magnetization fixed layer 12 to the magnetization fixed layer 11. When the write current IW is generated to flow from the magnetization fixed layer 12 to the magnetization fixed layer 11, a flow of spin-polarized electrons is generated from the magnetization fixed layer 11 to the magnetization fixed layer 12, and the domain wall 9 is moved to a position between the reference layer 41 and the magnetization fixed layer 12 by the flow of the spin-polarized electrons. This achieves the write of data "0" into the memory cell 200-1.

The write of data "1" is, on the other hand, achieved by generating a write current IW flowing from the magnetization fixed layer 11 to the magnetization fixed layer 12. When the write current IW is generated to flow from the magnetization fixed layer 11 to the magnetization fixed layer 12, a flow of spin-polarized electrons is generated from the magnetization fixed layer 12 to the magnetization fixed layer 11, and the domain wall 9 is moved to a position between the reference layer 41 and the magnetization fixed layer 11 by the flow of the spin-polarized electrons. This achieves the write of data "1" into the memory cell 200-1.

Figure 9A:
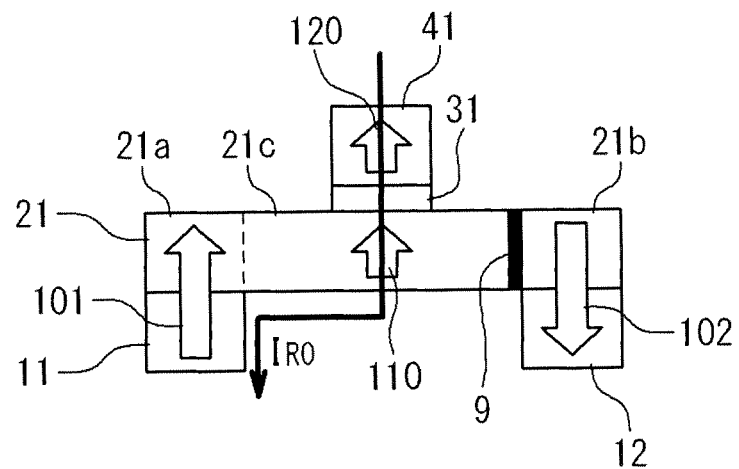
FIGS. 9A and 9B are diagrams showing a data read operation in the first embodiment.
Figure 9B:
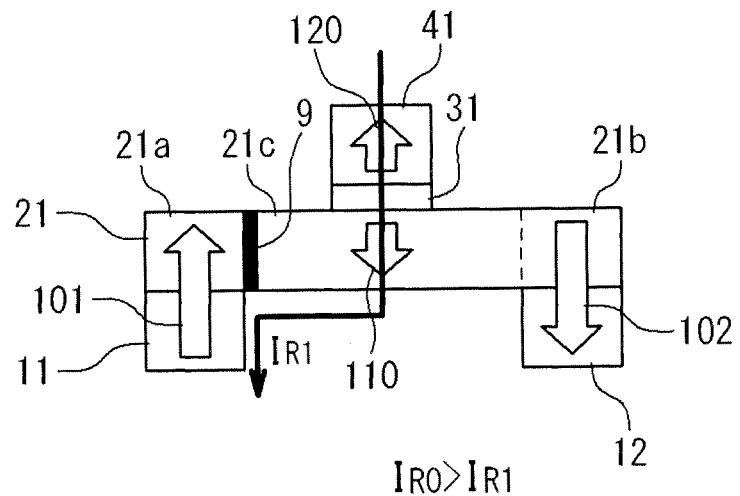

FIGS. 9A and 9B are schematic diagrams showing the read operation of a memory cell 200 in this embodiment. The data read is achieved by generating a read current flowing through the MTJ of each memory cell 200. Although FIGS. 9A and 9B show the read operation of the memory cell 200-1, the data read from the memory cell 200-2 can be achieved in the same way.

As shown in FIGS. 9A and 9B, the read operation is achieved by generating a read current flowing from the reference layer 41 to the magnetization fixed layer 11. When the magnetization fixed layer 11 is set to the grounding level GND and the reference layer 41 is set to a predetermined read voltage level $V_{READ}$, a read current flows through the MTJ. When the MTJ is written with data "0", that is, placed in the low resistance state, as shown in FIG. 9A, a relatively large read current $I_{R0}$ flows through the MTJ. When the MTJ is written with data "1", that is, placed in the high resistance state, as shown in FIG. 9B, a relatively small read current $I_R$, flows through the MTJ. This means that data stored in the memory cell 200 can be identified by identifying the read current flowing through the MTJ.

It should be noted that, in each memory cell of the domain wall motion type MRAM of this embodiment, no transistor is provided between the magnetization fixed layer 12 and the common bitline CBL, and the magnetization fixed layer 12 and the common bitline CBL are connected so that the electrical connection between them is unable to be unconnected. When memory cells 200 of this embodiment are integrated in a domain wall motion type MRAM, it is necessary to configure and operate a peripheral circuit of the domain wall motion type MRAM so as to be adapted to the above-described memory cell structure. In the following, detailed descriptions are given of the configuration and operation of the domain wall motion type MRAM of this embodiment.

Figure 10:
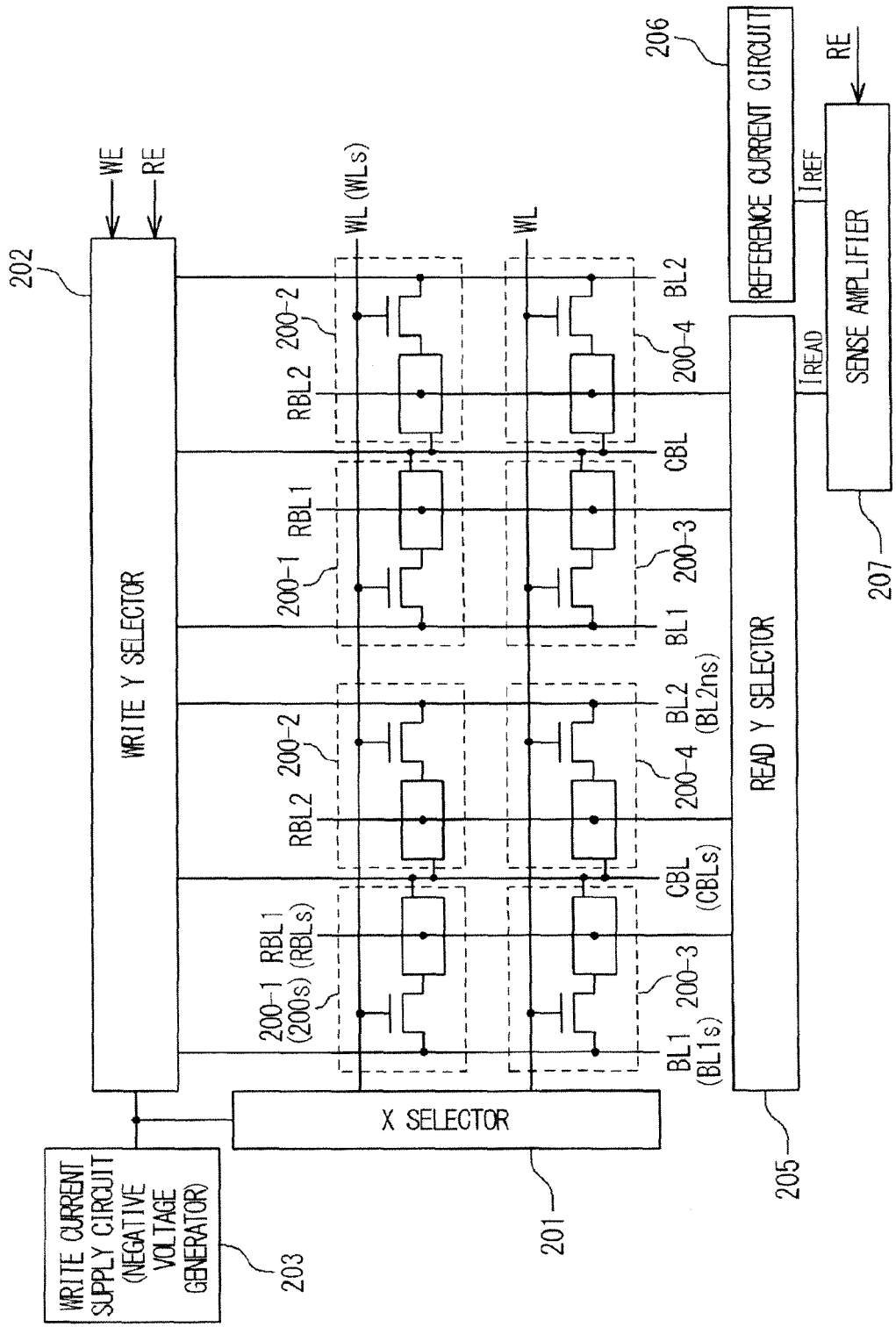
FIG. 10 is a block diagram showing an exemplary configuration of a domain wall motion type MRAM of the first embodiment.

FIG. 10 is a block diagram showing one example of the configuration of a domain wall motion type MRAM which incorporates memory cells 200 structured as shown in FIGS. 4, 5A to 5D and 6A. In this embodiment, the domain wall motion type MRAM includes a memory array in which the memory cells 200 are arranged in a matrix. Although eight memory cells 200 (memory cells 200-1 to 200-4) are shown in FIG. 10, it would be apparent to the person skilled in the art that a necessary number of memory cells 200 are actually arranged in the memory array. The memory array further includes write bitlines BL1, BL2, read bitlines RBL1, RBL2, common bitlines CBL and word lines WL.

The domain wall motion type MRAM further includes an X selector 201, a write Y selector 202, a write current supply circuit 203, a read Y selector 205, a reference current circuit 206 and a sense amplifier 207.

The X selector 201 is connected to the word liens WL and selects the word line WL connected to a selected memory cell (the memory cell 200 to be accessed) as a selected word line, in data write operations and data read operations. In FIG. 10, the selected memory cell is denoted by the numeral 200s and the selected word line is denoted by the numeral WLs. In the following, a description is given under an assumption that the memory cell 200-1 positioned at the upper left corner is selected as the selected memory cell 200s. The X selector 201 sets the selected word line WLs to the "high" level and the non-selected word lines WL to the "low" level. In this embodiment, the "high" level is a predetermined positive voltage level and the "low" level is a predetermined negative voltage level.

The write Y selector 202 is connected to the write bitlines BL1 and BL2 and selects the write bitline connected to the selected memory cell 200s as a selected write bitline. For example, the word bitline BL1 connected to the selected memory cell 200s is denoted by the numeral BL1s in FIG. 10. In addition, the write Y selector 202 controls the voltage levels of the selected write bitline, the write bitline paired with the selected write bitline and the common bitline CBL associated with the selected write bitline. In FIG. 10, the write bitline BL2 which is paired with the selected write bitline BL1s is denoted by the numeral BL2ns and the common bitline associated with the selected write bitline BL1s is denoted by the numeral CBLs. The voltage levels of the selected write bitline, the write bitline paired with the selected write bitline and the common bitline CBL associated with the selected write bitline are controlled in response to a write enable signal WE and a read enable signal RE.

The write current supply circuit 203 supplies a write current corresponding to data to be written via the selected write bitline connected to the selected memory cell 200s (in this embodiment, the write bitline BL1s). In this embodiment, the write current supply circuit 203 is adapted to supply both of positive and negative voltages. This is because the data write into the selected memory cell 200s is done while the common bitline CBLs associated with the selected write bitline BL1s is kept at the grounding level GND, as described below. In addition, the write current supply circuit 203 supplies a negative voltage to the X selector 201. The negative voltage supplied to the X selector 201 is used when the X selector 201 sets the word lines WL to the "low" level (that the predetermined negative voltage level).

The read Y selector 205 is connected to the read bitlines RBL1 and RBL2. The read Y selector 205 selects the read bitline RBL1 or RBL2 connected to the selected memory cell 200s (in FIG. 10, the read bitline RBL1) as the selected read bitline. In FIG. 10, the selected read bitline is denoted by the numeral RBLs.

The reference current circuit 206 generates a read reference current $I_{REF}$ and supplies the read reference current $I_{REF}$ to the sense amplifier 207. The sense amplifier 207 is connected to the selected read bitline RBLs by the read Y selector 205, and compares the read current $I_{READ}$ flowing through the selected read bitline RBLs with the read reference current $I_{REF}$. The difference between the read current $I_{READ}$ and the reference current $I_{REF}$, is amplified and externally outputted as data read out from the selected memory cell 200s.

Figure 11A:
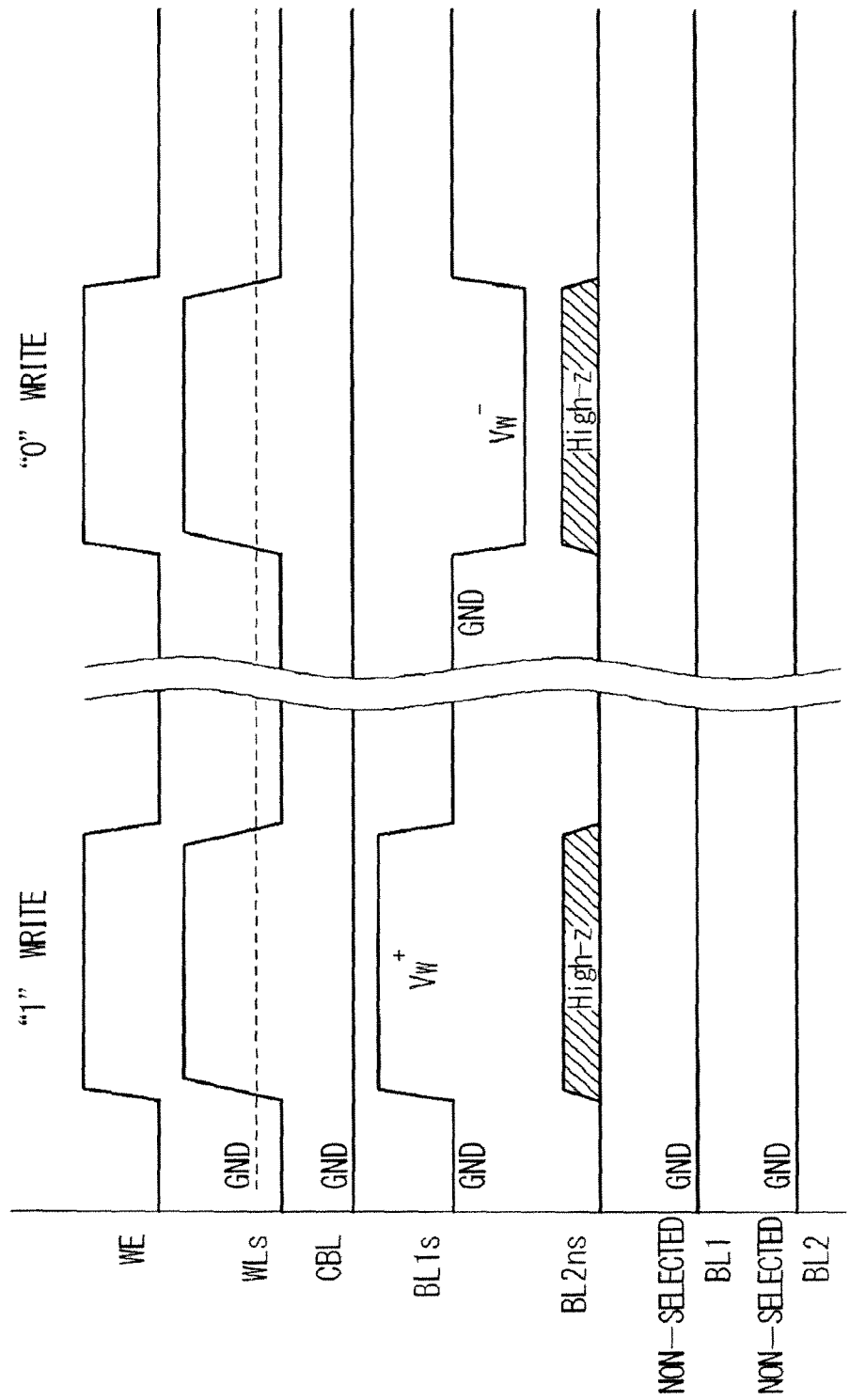
FIG. 11A is a timing chart showing a write operation of the domain wall motion type MRAM in the first embodiment.

FIG. 11A is a timing chart showing the write operation of the domain wall motion type MRAM configured as shown in FIG. 10. In FIG. 11A, the write operation is shown with an assumption that the memory cell 200-1 at the upper left corner (which is connected to a write bitline BL1) is the selected memory cell 200s. In the following, the selected write bitline connected to the selected memory cell 200s is referred to as the selected write bitline BL1s, and the word line WL connected to the selected memory cell 200s is referred to as the selected word line WLs. Furthermore, the write bitline BL2 paired with the selected write bitline BL1s is referred to as the write bitline BL2ns and the common bitline CBL associated with the selected write bitline BL1s is referred to as the common bitline CBLs. It would be easily understood by the person skilled in the art that the data write into other memory cells 200 (including memory cells 200 connected to the write bitlines BL2) can be performed in the similar way.

All the word lines WL are set to the predetermined "low" level when none of the write and read operations is performed. In this embodiment, the "low" level is set to a negative voltage level.

In the write operation, the selected word line WLs is pulled up from the "low" level to the "high" level, to thereby turn on the NMOS transistors 51 and 52 of the memory cells 200 connected to the selected word line WLs. The non-selected word lines WL are kept at the "low" level. Furthermore, in response to a pull-up of the write enable signal WE, the selected write bitline BL1s is set to the voltage level in accordance with data to be written and the common bitline CBLs associated with the selected write bitline BL1s is set to the grounding level GND. In detail, when data "1" are written in the selected memory cell 200s, a positive voltage $Vw^+$ is supplied to the selected write bitline BL1s from the write current supply circuit 203 and the common bitline CBLs is set to the grounding level GND. This causes a write current to flow from the selected write bitline BL1s to the common bitline CBLs. In other words, the write current flows from the magnetization fixed layer 11 to the magnetization fixed layer 12 and data "1" are thereby stored in the selected memory cell 200s.

When data "0" are written into the selected memory cell 200s, on the other hand, a negative voltage Vw is supplied to the selected write bitline BL1s from the write current supply circuit 203 and the common bitline CBLs is set to the grounding level GND. This causes a write current to flow from the common bitline CBLs to the selected write bitline BL1s. In other words, the write current flows from the magnetization fixed layer 12 to the magnetization fixed layer 11 and data "0" are thereby written into the selected memory cell 200s.

While the write current flows, the write bitline BL2ns, which is paired with the selected write bitline BL1s, is set to the high-impedance state. Furthermore, the other non-selected bitlines BL1 and BL2 are set to the grounding level GND.

FIG. 11B is a timing chart which shows the read operation of the domain wall motion type MRAM configured as shown in FIG. 10. In FIG. 11B, the read operation is shown under an assumption that the memory cell 200-1 at the upper left corner (which is connected to the read bitline RBL1) is selected as the selected memory cell 200s. In the following, the read bitline RBL1 connected to the selected memory cell 200s is referred to as the selected read bitline RBLs. It would be easily understood by the person skilled in the art that the data read from other memory cells 200 (including memory cells 200 connected to the read bitlines RBL2) can be performed in the similar way.

In the read operation, the selected word line WLs is pulled up from the "low" level (the predetermined negative voltage level) to the "high" level to turn on the NMOS transistors 51 and 52 of the memory cells 200 connected to the selected word line WLs. The non-selected word lines WL are kept at the "low" level. Furthermore, in synchronization with a pull-up of the read enable signal RE, all the common bitlines CBL are set to the high-impedance state and all the write bitlines BL1 and BL2 are set to the grounding level. In addition, the selected read bitline RBLs connected to the selected memory cell 200s is set to the read voltage level $V_{READ}$. When the read enable signal RE is pulled up to enable the sense amplifier 207, the sense amplifier 207 compares the read current $I_{READ}$, which flows through the selected memory cell 200s, with the reference current $I_{REF}$ received from the reference current circuit 206. When the read current $I_{READ}$ is larger than the reference current $I_{REF}$, the selected memory cell 200s is determined as storing data "0"; when the read current $I_{READ}$ is smaller than the reference current $I_{REF}$, the selected memory cell 200s is determined as storing data "1".

It should be noted that the negative voltage supplied from the write current supply circuit 203 is used to generate the negative voltage level to which the non-selected word lines WL are to be set. The leak currents through the NMOS transistors 51 and 52 of the non-selected memory cells 200 can be reduced by setting the non-selected word lines WL to a negative voltage level. In the meantime, the increase in the hardware can be effectively reduced by using the function of generating the negative voltage Vw of the write current supply circuit 203 also for setting the non-selected word lines WL to the negative voltage level.

As thus described, in the domain wall motion type MRAM of the first embodiment, one of the magnetization fixed layers of each of adjacent memory cells 200-1 and 200-2 (that is, the magnetization fixed layer 12), is directly connected to the common bitlines CBL, and the magnetization fixed layer 12 and the common bitline CBL are shared by the memory cells 200-1 and 200-2. Such a structure effectively reduces the area of each memory cell 200.

Second Embodiment

Figure 12:
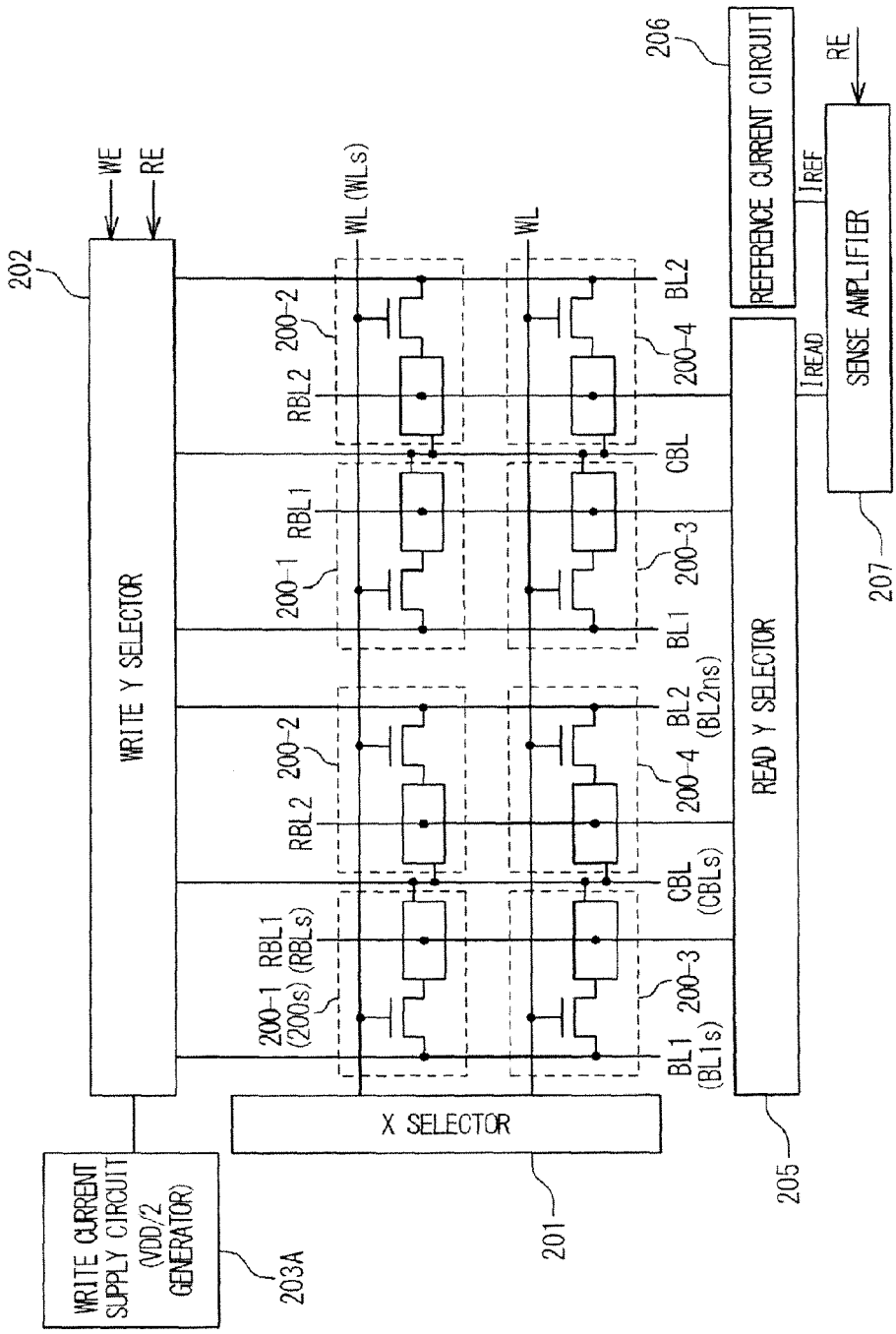
FIG. 12 is a block diagram showing an exemplary configuration of a domain wall motion type MRAM of a second embodiment.

FIG. 12 is a block diagram showing an exemplary configuration of a domain wall motion type MRAM according to a second embodiment. In this embodiment, in contrast to the first embodiment, the selected common bitline CBLs is set to the voltage VDD/2 which is the half of the power supply voltage VDD in the write operation; it should be noted that the common bitlines CBL are set to the grounding level GND in the write operation in the first embodiment. In accordance with this modification, a write current supply circuit 203A is used in this embodiment which has the function of generating the voltage VDD/2. Furthermore, no negative voltage is supplied to the X selector 201 in this embodiment. The "low" level of the word lines WL is set to the grounding level GND in this embodiment.

Figure 13:
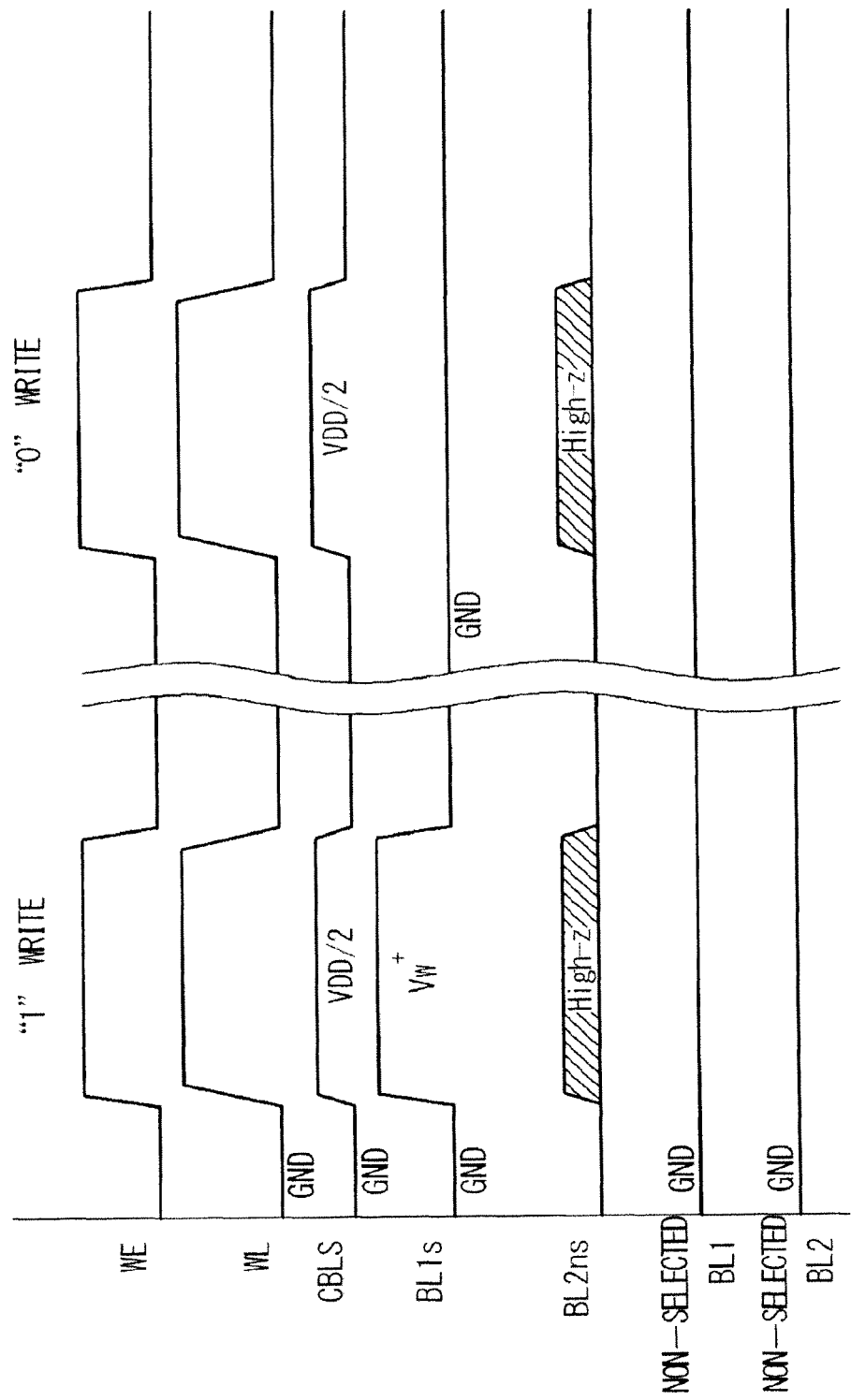
FIG. 13 is a timing chart showing a write operation of the domain wall motion type MRAM in the second embodiment.

FIG. 13 is a timing chart showing the operation of the domain wall motion type MRAM in the second embodiment. The write operation is described also under the assumption that the memory cell 200-1 at the upper left corner is selected as the selected memory cell 200s in the second embodiment. The data write can be achieved by the similar operation, also when data are written into other memory cells 200.

In the write operation, the selected word line WLs is pulled up from the "low" level (the grounding level GND) to the "high" level to turn on the NMOS transistors 51 and 52 of the memory cells 200 connected to the selected word line WLs. Furthermore, in response to a pull-up of the write enable signal WE, the common bitline CBLs associated with the selected memory cell 200s is set to the voltage level of VDD/2, and the selected write bitline BL1s connected to the selected memory cell 200s is set to the voltage level in accordance with data to be written into the selected memory cell 200s. The non-selected common bitlines CBL are set to the grounding level GND. In detail, when data "1" are written into the selected memory cell 200s, the selected write bitline BL1s connected to the selected memory cell 200s is set to a positive voltage $Vw^+$ higher than the voltage VDD/2. Most simply, the power supply voltage VDD may be used as the positive voltage $Vw^+$. This causes a write current to flow from the selected write bitline BL1s to the selected common bitline CBLs. In other words, the write current flows from the magnetization fixed layer 11 to the magnetization fixed layer 12 to thereby write data "1" into the selected memory cell 200s.

When data "0" are written into the selected memory cell 200s, on the other hand, the selected write bitline BL1s connected to the selected memory cell 200s is set to the grounding level GND. This causes a write current to flow from the selected common bitline CBLs to the selected write bitline BL1s. In other words, the write current flows from the magnetization fixed layer 12 to the magnetization fixed layer 11 to thereby write data "0" into the selected memory cell 200s.

While the write current flows, the write bitline BL2ns which is paired with the selected write bitline BL1s is set to the high-impedance state. Also, the other non-selected write bitlines BL1 and BL2 are set to the grounding level GND.

The configuration of the first embodiment requires a negative voltage generator circuit; however, the negative voltage generator circuit tends to have a large circuit size in general. The domain wall motion type MRAM of the second embodiment, which eliminates the need of integration of a negative voltage generator circuit, is advantageous in terms of the reduction in the circuit size.

Third Embodiment

Figure 14:
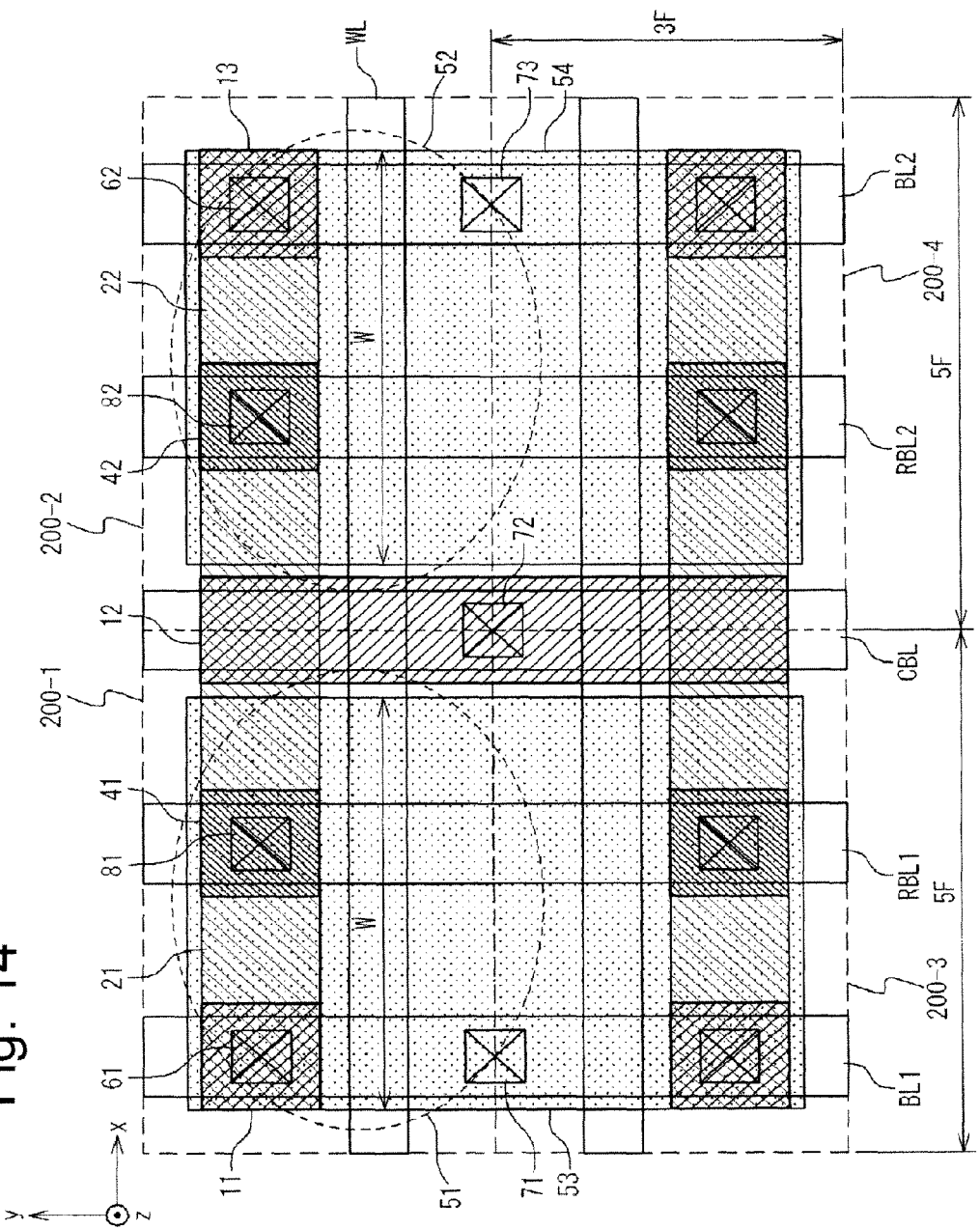
FIG. 14 is a diagram showing an exemplary layout of memory cells in a third embodiment.
Figure 15:
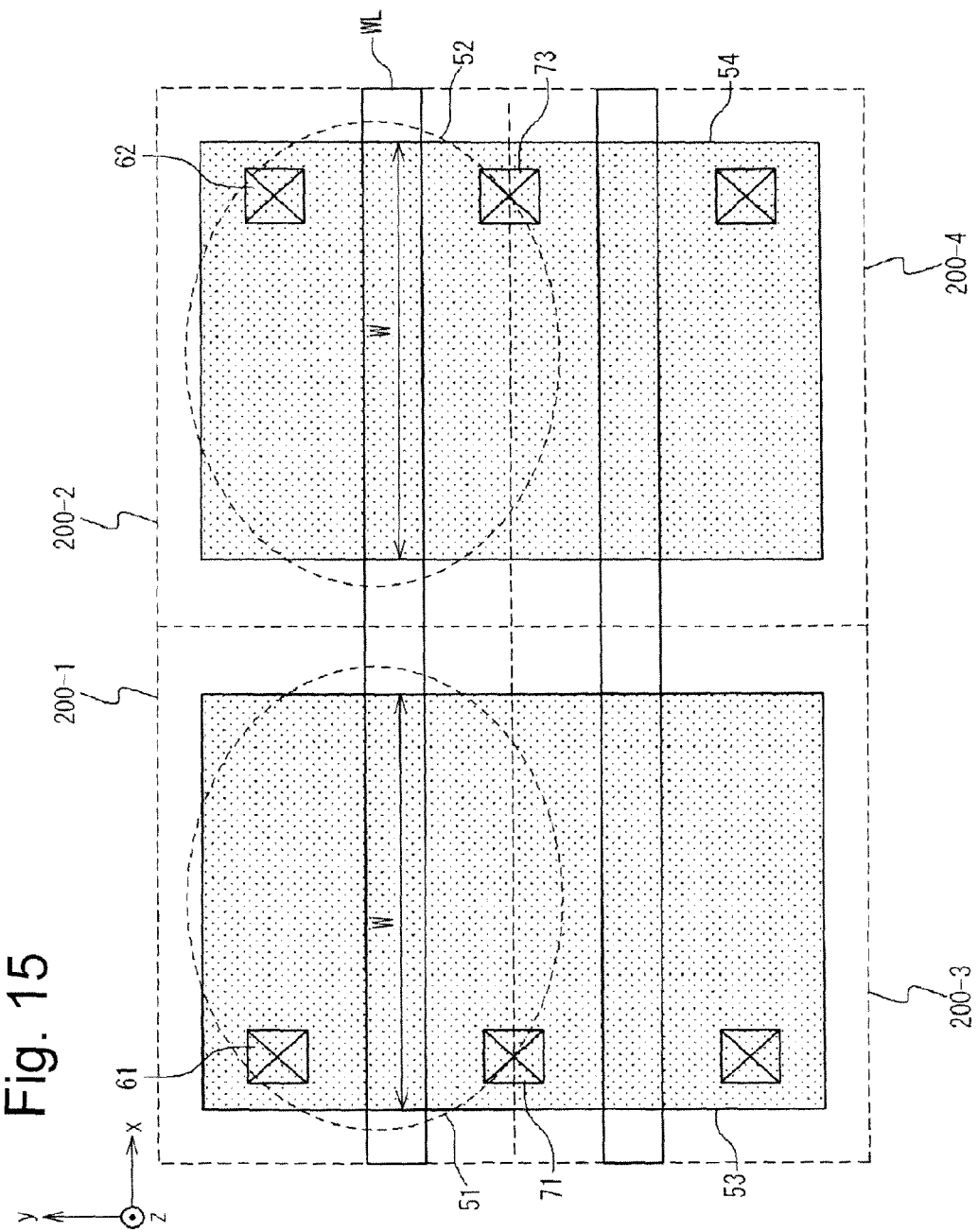
FIG. 15 is a diagram showing exemplary layouts of diffusion layers and word lines of the memory cells shown in FIG. 14.

FIG. 14 is a plan view showing an exemplary layout of memory cells of an MRAM according to a third embodiment, and FIG. 15 is a plan view showing an exemplary arrangement of the diffusion layers 53, 54 and the word lines WL in the third embodiment. In the layout is the third embodiment, as shown in FIGS. 14 and 15, the widths W of the diffusion layers 53 and 54 (that is, the channel width or gate width) are increased compared to the layout shown in FIGS. 4 and 5A. More specifically, the diffusion layer 53 is disposed so as to at least reach the region under the read bitline RBL1 from the via-contact 71 which connects the write bitline BL1 and the diffusion layer 53 and the diffusion layer 54 is disposed so as to at least reach the region under the read bitline RBL2 from the via-contact 73 which connects the write bitline BL2 and the diffusion layer 54. In the layout shown in FIG. 14, the diffusion layer 53 is disposed to reach the region between the read bitline RBL1 and the common bit line CBL and the diffusion layer 54 is disposed to reach the region between the read bitline RBL2 and the common bit line CBL.

The increase in the channel widths (gate widths) of the NMOS transistors 51 and 52 allows a large write current to flow, and effectively reduces the length of time necessary for completing the data write. In order to generate a larger write current, it is preferable that the spacing between the diffusion layers 53 and 54 is adjusted to the minimum dimension allowed in the design rules used for manufacturing the MRAM. This allows maximizing the channel widths of the NMOS transistors 51 and 52.

Fourth Embodiment

Figure 16:
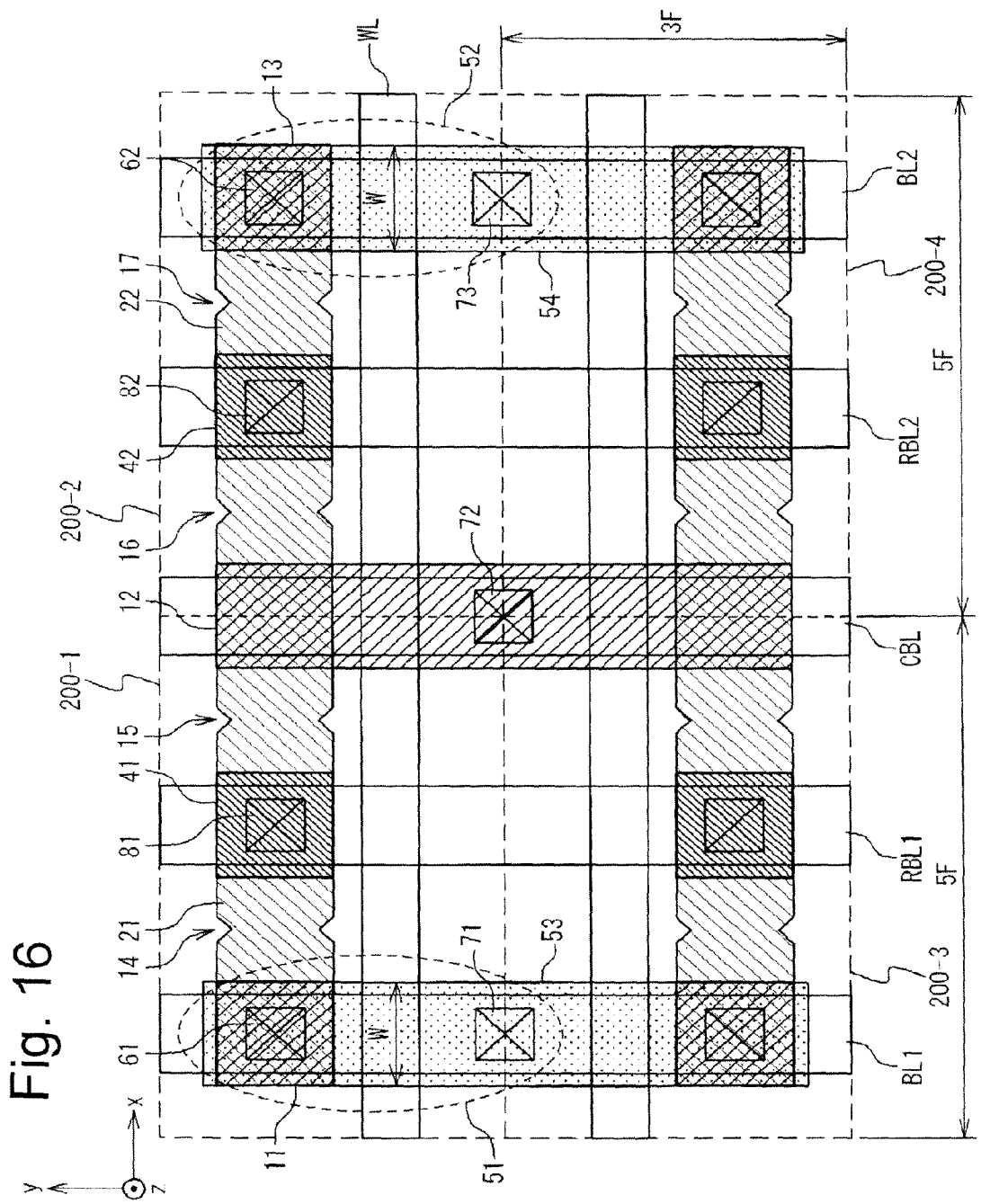
FIG. 16 is a diagram showing an exemplary layout of memory cells in a fourth embodiment.

FIG. 16 is a layout diagram showing the layout of memory cells 200 of a domain wall motion type MRAM according to a fourth embodiment. In the fourth embodiment, notches 14 to 17 are provided for the magnetic recording layers 21 and 22. The notches 14 are positioned between the magnetization fixed layer 11 and the reference layer 41 and the notches 15 are positioned between the reference layer 42 and the magnetization fixed layer 12. Furthermore, the notches 16 are positioned between the magnetization fixed layer 12 and the reference layer 43 and the notches 17 are positioned between the reference layer 42 and the magnetization fixed layer 13.

The notches 14 to 17 function as pin potentials for the magnetic domain wall. Accordingly, the notches 14 to 17 make it easy to control the position of the magnetic domain wall in the magnetic recording layers 21 and 22, effectively improving the reliability of the data write.

Fifth Embodiment

Figure 17:
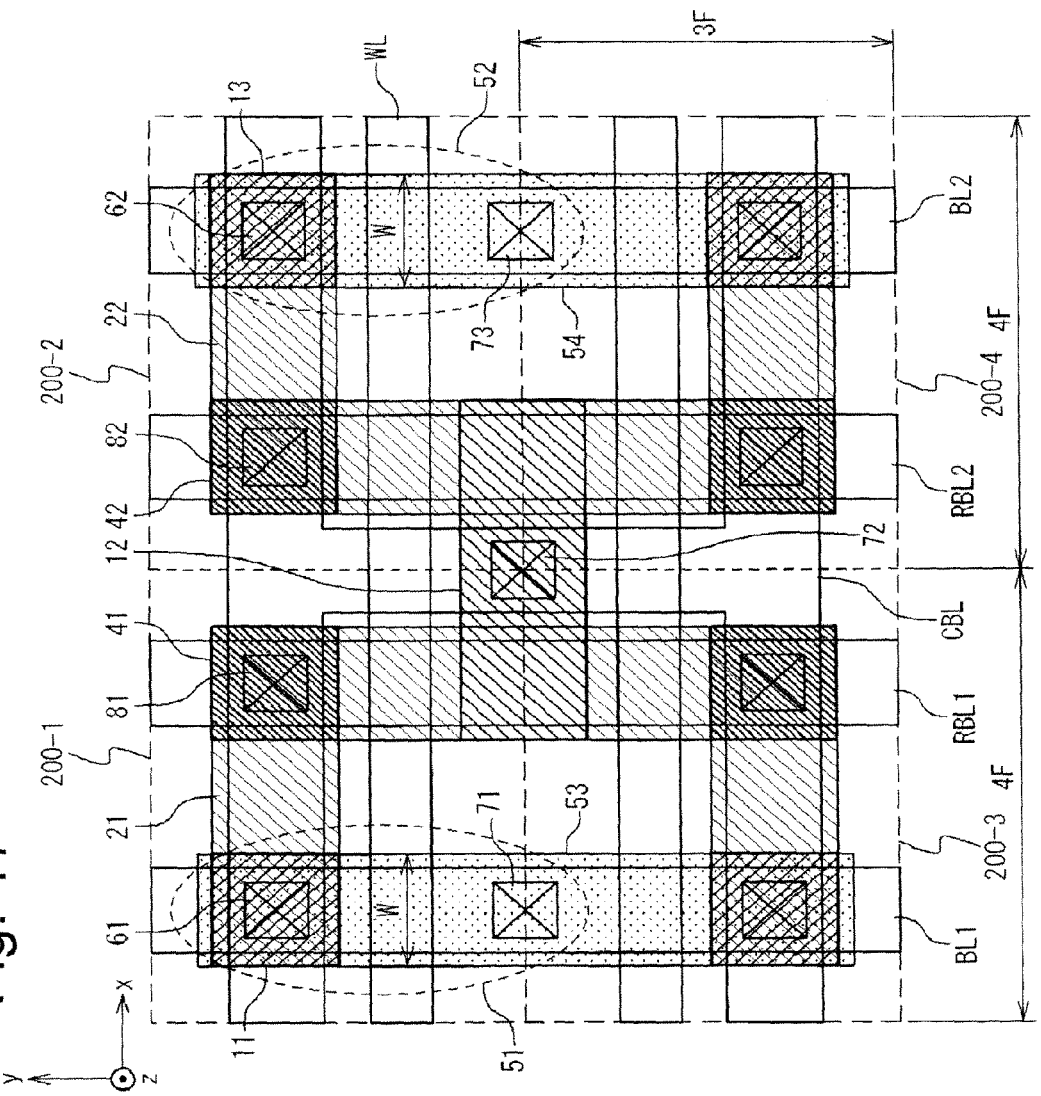
FIG. 17 is a diagram showing an exemplary layout of memory cells in a fifth embodiment.

FIG. 17 is a plan view showing an exemplary layout of memory cells 200 of a domain wall motion type MRAM according to a fifth embodiment. FIGS. 18A to 18D are plan views showing exemplary layouts of individual components of the memory cells 200. FIG. 19A is a section view showing the cross section structure of the memory cells 200. Presented in the fifth embodiment is a layout for further reducing the area of each memory cell 200. It should be noted that four memory cells 200-1 to 200-4 are shown in FIGS. 17 and 18A to 18D, and FIG. 19A shows the cross section structure in the a1-a2-a3-a4 section indicated in FIG. 19B. The in-plane layout of the memory cells 200-3 and 200-4 and that of the memory cells 200-1 and 200-2 are in line symmetry with respect to the memory cell boundary which extends in the x direction. Accordingly, only the structure of the memory cells 200-1 and 200-2 is mainly described below.

In the fifth embodiment, the common bit lines CBL are disposed to extend in the direction perpendicular to the write bitlines BL1, BL2 and the read bitlines RBL1 and RBL2 (that is, the direction parallel to the word lines WL). This reduces the number of interconnections which intersect each memory cell 200 in the y direction, reducing the area of each memory cell 200. In the following, a detailed description is given of the layout of the memory cells 200 in the fifth embodiment.

Figure 18A:
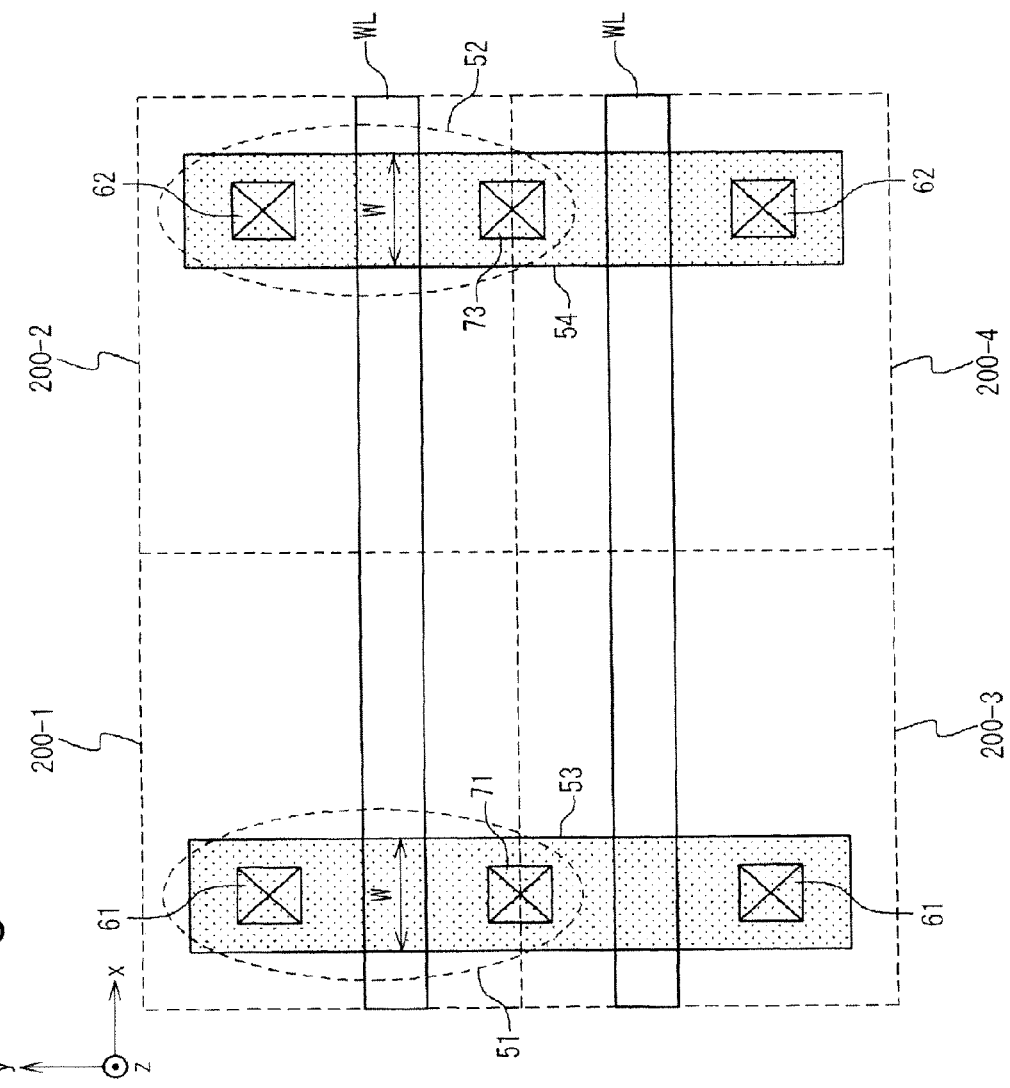
FIG. 18A is a diagram showing exemplary layouts of diffusion layers and word lines of the memory cells shown in FIG. 17.

In this embodiment, as shown in FIGS. 17 and 18A, the diffusion layers 53 and 54 are disposed to extend in the y direction, as is the case with the first embodiment, and the word lines WL are disposed to extend in the x direction, intersecting the diffusion layers 53 and 54. The regions of the word lines WL which overlap the diffusion layers 53 and 54 are used as the gates of the NMOS transistors 51 and 52. The drains of the NMOS transistors 51 and 52 are connected to the magnetization fixed layers 11 and 13 via the via-contacts 61 and 62, respectively. The sources of the NMOS transistors 51 and 52 are connected to the magnetization fixed layers 11 and 13 via the via-contacts 61 and 62, respectively. The via-contact 71 is disposed to overlap the boundary between the memory cells 200-1 and 200-3 and shared by the memory cells 200-1 and 200-3. Similarly, the via-contact 73 is disposed to overlap the boundary between the memory cells 200-2 and 200-4 and shared by the memory cells 200-2 and 200-4.

Figure 18B:
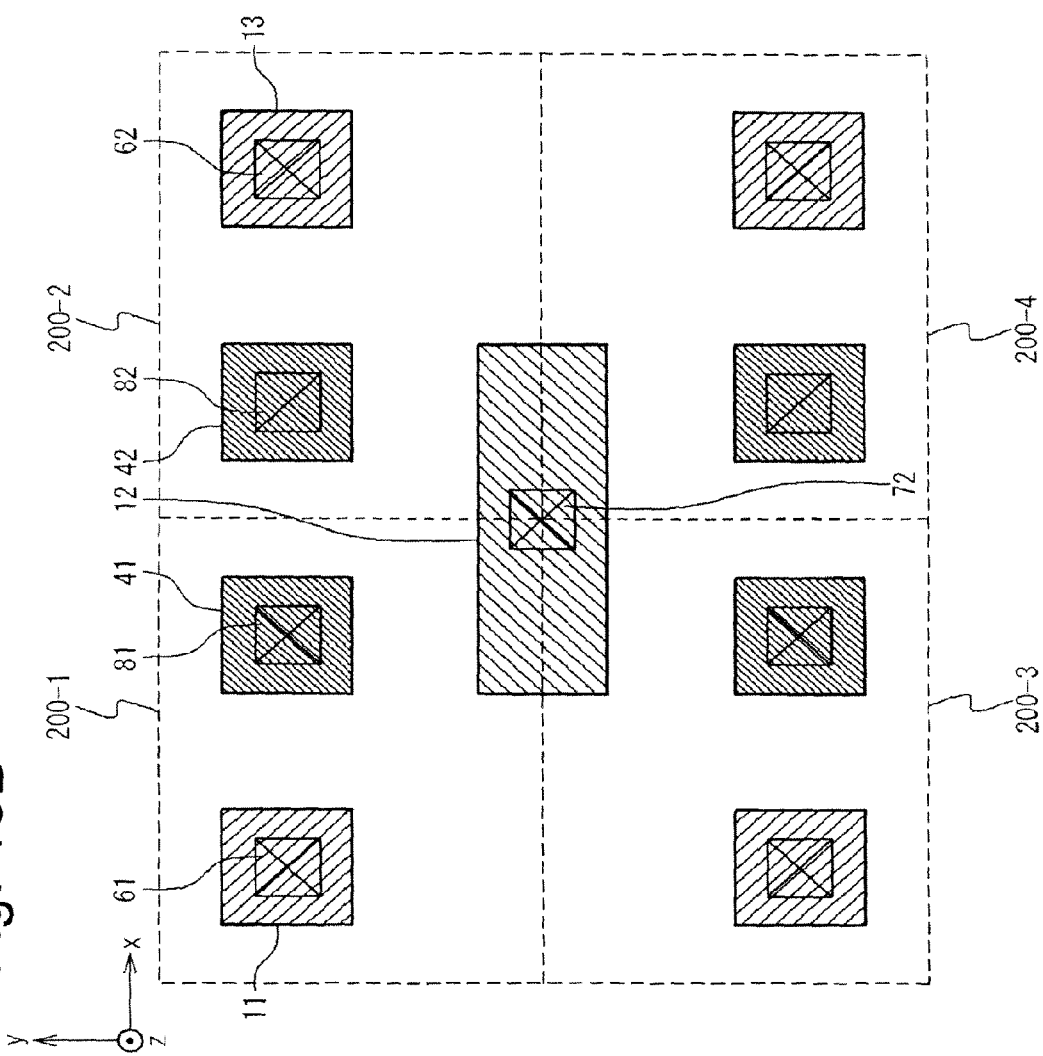
FIG. 18B is a diagram showing exemplary layouts of magnetization fixed layers and reference layers of the memory cells shown in FIG. 17.

As shown in FIGS. 17 and 18B, each of the memory cells 200-1 to 200-4 incorporates the magnetization fixed layer 11 or 13. Furthermore, the reference layers 41 and 42 are positioned between the magnetization fixed layers 11 and 13. The magnetization fixed layer 11, the reference layers 41, 42 and the magnetization fixed layer 13 are arranged in line in the +x direction. The reference layers 41 and 42 are connected to the read bitlines RBL1 and RBL2 via the via-contacts 81 and 82, respectively.

Furthermore, the magnetization fixed layer 12 of the memory cells 200-1 to 200-4 are disposed to overlap the boundary between the memory cells 200-1 and 200-2 and the boundary between the memory cells 200-3 and 200-4. The magnetization fixed layer 12 of the memory cells 200-1 to 200-4 is formed in a physically unitary component. In this embodiment, the magnetization fixed layer 12 is positioned between the reference layers 41 and 42 of the memory cells 200-1 and 200-2 and those of the memory cells 200-3 and 200-4. The magnetization fixed layer 12 is connected to the common bitline CBL via the via-contact 72. It should be noted that the via-contact 72 is disposed to overlap the boundaries of the memory cells 200-1 to 200-4, and shared by the memory cells 200-1 to 200-4.

It should be noted that the magnetization fixed layer 12 is positioned at a position away from the reference layers 41 and 42 of the memory cells 200-1 and 200-2 in the −y direction and away from the reference layers 41 and 42 of the memory cells 200-3 and 200-4 in the +y direction; note that, in the layout shown in FIG. 5B, the magnetization fixed layer 12 is positioned at a position away from the reference layers 41 and 42 of the memory cells 200-1 and 200-3 in the +x direction and away from the reference layers 41 and 42 of the memory cells 200-2 and 200-4 in the −x direction. Such a layout reduces the width of each memory cell 200 in the x direction, reducing the area of each memory cell 200.

In addition, as shown in FIGS. 17 and 18C, the magnetic recording layers 21 of the memory cells 200-1 and 200-3, which adjoin each other, are formed as a physically unitary component, and the magnetic recording layers 22 of the memory cells 200-2 and 200-4, which adjoin each other, are formed as another physically unitary component. It should be noted that the magnetic recording layers 21 and 22 are formed to be bent. In detail, the magnetic recording layer 21 of the memory cell 200-1 extends in the +x direction from the position opposing to the magnetization fixed layer 11 (See FIG. 18B) to reach the position opposing to the reference layer 41 and further extends in the −y direction from the position opposing to the reference layer 41 to reach the position opposing to the magnetization fixed layer 12. The shape of the magnetic recording layer 21 of the memory cell 200-1 and that of the magnetic recording layer 21 of the memory cell 200-3 are in line-symmetry with respect to the boundary between the memory cells 200-1 and 200-3. The magnetization fixed region 21b, which is the portion coupled to the magnetization fixed layer 12 of the magnetic recording layer 21, is shared by the memory cells 200-1 and 200-3. Similarly, the magnetic recording layer 22 of the memory cell 200-2 extends in the −x direction from the position opposing to the magnetization fixed layer 13 (See FIG. 18B) to reach the position opposing to the reference layer 42 and further extends in the −y direction from the position opposing to the reference layer 42 to reach the position opposing to the magnetization fixed layer 12. The shape of the magnetic recording layer 22 of the memory cell 200-2 and that of the magnetic recording layer 22 of the memory cell 200-4 are in line-symmetry with respect to the boundary between the memory cells 200-2 and 200-4. The magnetization fixed region 22b, which is the portion coupled to the magnetization fixed layer 12 of the magnetic recording layer 22, is shared by the memory cells 200-2 and 200-4. Such a structure is also effective for reducing the area of each memory cell.

Figure 18D:
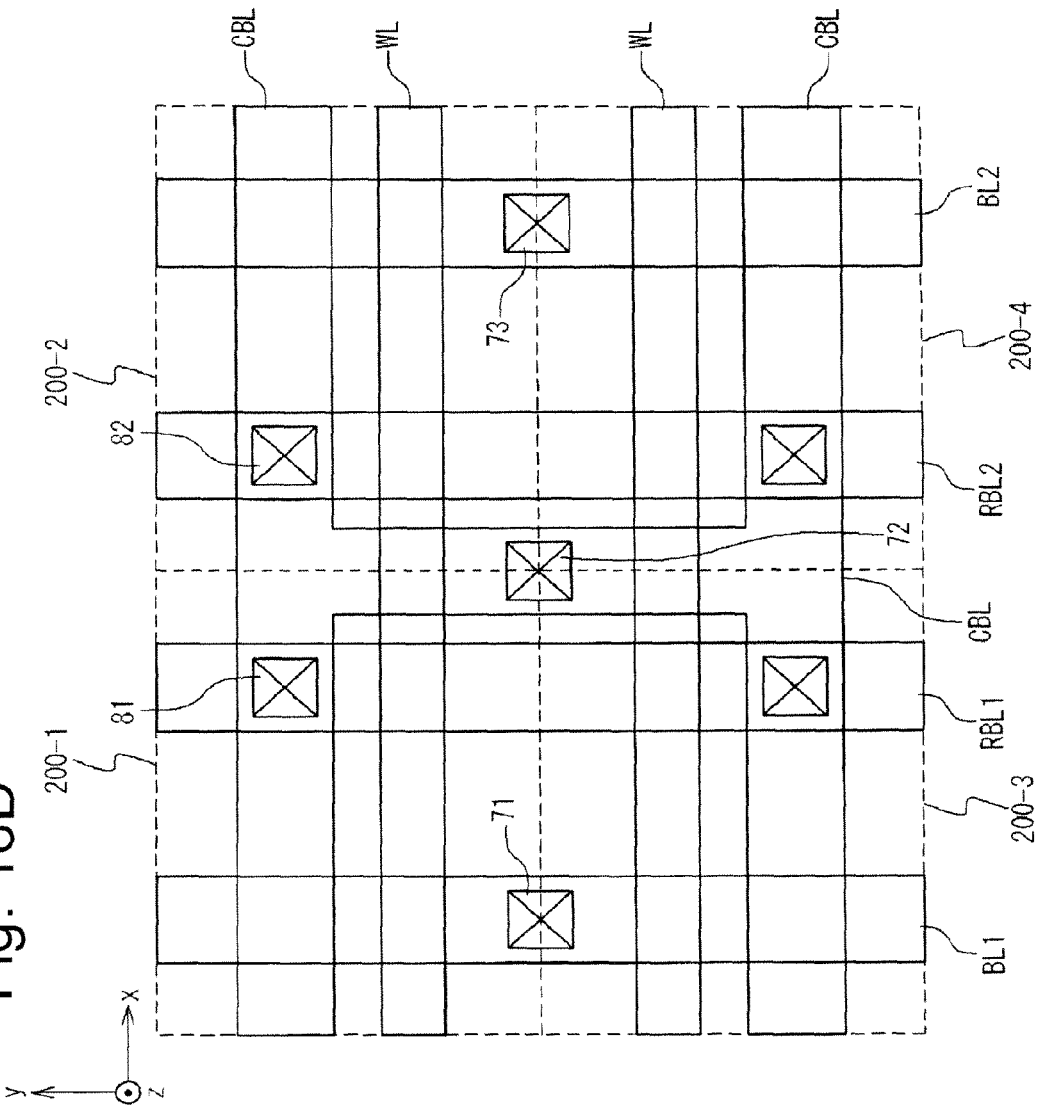
FIG. 18D is a diagram showing exemplary layouts of write bitlines, read bitlines and a common bit line of the memory cells shown in FIG. 17.

In this embodiment, as shown in FIGS. 17 and 18D, the write bitlines BL1, BL2 and the read bitlines RBL1 and RBL2 are disposed to extend in the y direction, and the common bitlines CBL are disposed to extend in the x direction. Such an arrangement can be realized by disposing the common bitlines CBL in a metal interconnection layer different from the metal interconnection layer in which the write bitlines BL1, BL2 and the read bitlines RBL1 and RBL2 are disposed. The common bitline CBL which passes through the memory cells 200-1 and 200-2 is connected to the common bitline CBL which passes through the memory cells 200-3 and 200-4 via a bridge interconnection 74 and the bridge interconnection 74 is connected to the magnetization fixed layer 12 via a via-contact 72.

The memory cell layout of this embodiment shown in FIGS. 17 and 18A to 18D, in which the number of the interconnections intersecting the memory cells 200 in the y direction is reduced, can further reduce the area of each memory cell 200. In terms of the memory cell area, the total area of the two adjacent memory cells 200 is 30F$^2$ (=5F×3F×2) in the layout shown in FIG. 4. In this embodiment, on the other hand, the total area of the two adjacent memory cells 200 is 24F$^2$ (=4F×3F×2). As thus discussed, the layout of this embodiment further suppresses the increase in the memory cell area, enabling improvement of the degree of integration.

Although various embodiments of the present invention are described above, the present invention should not be interpreted as being limited to the above-described embodiment; the present invention may be implemented with various modifications apparent to the person skilled in the art. It should be also noted that two or more the above-described embodiments may be implemented in combination, if there is no technical inconsistency. For example, the layouts of the magnetic random access memories according to the third and fourth embodiments are applicable to the magnetic random access memories according to other embodiments.

What is claimed is:

1. A semiconductor device, comprising:
a first memory cell;
a second memory cell adjacent to said first memory cell;
first and second write bitlines; and
a common bitline,
wherein said first memory cell includes:
 a first magnetization fixed layer having a magnetization fixed in a first direction;
 a first magnetic recording layer coupled to said first magnetization fixed layer and formed of ferromagnetic material;
 a first reference layer disposed opposed to said first magnetic recording layer;
 a first tunnel barrier film disposed between said first magnetic recording layer and said first reference layer; and
 a first transistor connected between said first magnetization fixed layer and said first write bitline,
wherein said second memory cell includes:
 a second magnetization fixed layer having a magnetization fixed in said first direction;
 a second magnetic recording layer coupled to said second magnetization fixed layer and formed of ferromagnetic material;
 a second reference layer disposed opposed to said second magnetic recording layer;
 a second tunnel barrier layer disposed between said second magnetic recording layer and said second reference layer; and
 a second transistor connected between said second magnetization fixed layer and said second write bitline,
wherein said first and second reference layer each have a magnetization fixed in said first direction or in a second direction opposite to said first direction,
wherein a common magnetization fixed layer having a magnetization fixed in said second direction is coupled to said first and second magnetic recording layers, and
wherein said common magnetization fixed layer and said common bitline is connected so that said common magnetization fixed layer and said common bitline are unable to be electrically unconnected.

2. The semiconductor device according to claim 1, wherein a write operation of said first memory cell is achieved by turning on said first transistor, setting said common bitline to a grounding level and setting said first write bitline to one of a positive voltage and a negative voltage, said one being selected in response to data to be written.

3. The semiconductor device according to claim 1, wherein a write operation of said first memory cell is achieved by turning on said first transistor, setting said common bitline to a half-VDD level which is a half of a power supply voltage and setting said first write bitline to one of a positive voltage higher than said half-VDD level and a grounding level, said one being selected in response to data to be written.

4. The semiconductor device according to claim 1, wherein a read operation of said first memory cell is achieved by turning on said first transistor, setting said first write bitline to a grounding level, setting said common bitline to a high-impedance state and setting said first reference layer to a predetermined voltage level.

5. The semiconductor device according to claim 1, wherein said first magnetic recording layer of said first memory cell and said second magnetic recording layer of said second memory cell are formed as a physically unitary component.

6. The semiconductor device according to claim 5, further comprising third and fourth memory cells,
- wherein said second memory cell adjoins said first memory cell in a third direction,
- wherein said third memory cell adjoins said first memory cell in a fourth direction perpendicular to said third direction,
- wherein said fourth memory cell adjoins said second memory cell in said fourth direction,
- wherein said third memory cell includes:
  - a third magnetization fixed layer having a magnetization fixed in said first direction;
  - a third magnetic recording layer coupled to said third magnetization fixed layer and formed of ferromagnetic material;
  - a third reference layer disposed opposed to said third magnetic recording layer;
  - a third tunnel barrier film disposed between said third magnetic recording layer and said third reference layer; and
  - a third transistor connected between said third magnetization fixed layer and said first write bitline,
- wherein said fourth memory cell includes:
  - a fourth magnetization fixed layer having a magnetization fixed in said first direction;
  - a fourth magnetic recording layer coupled to said fourth magnetization fixed layer and formed of ferromagnetic material;
  - a fourth reference layer disposed opposed to said fourth magnetic recording layer;
  - a fourth tunnel barrier film disposed between said fourth magnetic recording layer and said fourth reference layer; and
  - a fourth transistor connected between said fourth magnetization fixed layer and said second write bitline,
- wherein said common magnetization fixed layer is coupled to said third and fourth magnetic recording layers, and
- wherein a via-contact connected between said common magnetization fixed layer and said common bitline is disposed to overlap boundaries defined for first to fourth memory cells.

7. The semiconductor device according to claim 1, wherein said second memory cell adjoins said first memory cell in a third direction,
- wherein said first and second write bitlines are disposed to extend in a fourth direction perpendicular to said third direction, and
- wherein said common bitline is disposed to extend in said third direction.

8. The semiconductor device according to claim 7, further comprising third and fourth memory cells,
- wherein said third memory cell adjoins said first memory cell in said fourth direction;
- wherein said fourth memory cell adjoins said second memory cell in said fourth direction;
- wherein said third memory cell includes:
  - a third magnetization fixed layer having a magnetization fixed in said first direction;
  - a third magnetic recording layer coupled to said third magnetization fixed layer and formed of ferromagnetic material;
  - a third reference layer disposed opposed to said third magnetic recording layer;
  - a third tunnel barrier film disposed between said third magnetic recording layer and said third reference layer; and
  - a third transistor connected between said third magnetization fixed layer and said first write bitline,
- wherein said fourth memory cell includes:
  - a fourth magnetization fixed layer having a magnetization fixed in said first direction;
  - a fourth magnetic recording layer coupled to said fourth magnetization fixed layer and formed of ferromagnetic material;
  - a fourth reference layer disposed opposed to said fourth magnetic recording layer;
  - a fourth tunnel barrier film disposed between said fourth magnetic recording layer and said fourth reference layer; and
  - a fourth transistor connected between said fourth magnetization fixed layer and said second write bitline,
- wherein said first and third magnetic recording layers are formed as a physically unitary component,
- wherein said second and fourth magnetic recording layers are formed as a physically unitary component, and
- wherein a via-contact connected between said common magnetization fixed layer and said common bitline is disposed to overlap boundaries defined for first to fourth memory cells.

9. The semiconductor device according to claim 8, wherein said first and third reference layers are positioned at positions away from said first and third magnetization fixed layers, respectively, and
- wherein a position where said common magnetization fixed layer is coupled to said first and third magnetic recording layers is positioned away from said first reference layer in said fourth direction and positioned away from said third reference layer in a fifth direction opposite to said fourth direction.

10. The semiconductor device according to claim 1, further comprising:
- a first read bitline connected to said first reference layer and disposed in parallel to said first write bitline,
- wherein said first transistor is formed by a first diffusion layer and a word line disposed to intersect said first diffusion layer, and
- wherein said first diffusion layer extends from a via-contact connected between a source of said first transistor and said first write bitline to at least reach a region under said first read bitline.

11. The semiconductor device according to claim 10, further comprising:
- a second read bitline connected to said second reference layer and disposed in parallel to said second write bitline,
- wherein said second transistor is formed by a second diffusion layer and said word line,
- wherein said word line is disposed to intersect said second diffusion layer, and
- wherein said second diffusion layer extends from a via-contact connected between a source of said second transistor and said second write bitline to at least reach a region under said second read bitline.

12. The semiconductor device according to claim 1, wherein said first magnetic recording layer has notches at a first position between said first reference layer and said first magnetization fixed layer and at a second position between said first reference layer and said common magnetization fixed layer, and
wherein said second magnetic recording layer has notches at a third position between said second reference layer and said second magnetization fixed layer and at a fourth position between said second reference layer and said common magnetization fixed layer.

13. A magnetic random access memory, comprising:
a first memory cell;
a second memory cell adjacent to said first memory cell;
first and second write bitlines; and
a common bitline,
wherein said first memory cell includes:
   a first magnetization fixed layer having a magnetization fixed in a first direction;
   a first magnetic recording layer coupled to said first magnetization fixed layer and formed of ferromagnetic material;
   a first reference layer disposed opposed to said first magnetic recording layer;
   a first tunnel barrier film disposed between said first magnetic recording layer and said first reference layer; and
   a first transistor connected between said first magnetization fixed layer and said first write bitline,
wherein said second memory cell includes:
   a second magnetization fixed layer having a magnetization fixed in said first direction;
   a second magnetic recording layer coupled to said second magnetization fixed layer and formed of ferromagnetic material;
   a second reference layer disposed opposed to said second magnetic recording layer;
   a second tunnel barrier layer disposed between said second magnetic recording layer and said second reference layer; and
   a second transistor connected between said second magnetization fixed layer and said second write bitline,
wherein said first and second reference layer each have a magnetization fixed in said first direction or in a second direction opposite to said first direction,
wherein a common magnetization fixed layer having a magnetization fixed in said second direction is coupled to said first and second magnetic recording layers, and
wherein said common magnetization fixed layer and said common bitline is connected so that said common magnetization fixed layer and said common bitline are unable to be electrically unconnected.

* * * * *